US010982136B2

(12) United States Patent
Agbo et al.

(10) Patent No.: US 10,982,136 B2
(45) Date of Patent: Apr. 20, 2021

(54) LIGAND-SENSITIZED LANTHANIDE NANOCRYSTALS AS ULTRAVIOLET DOWNCONVERTERS

(71) Applicant: THE REGENTS OF THE UNIVERSITY OF CALIFORNIA, Oakland, CA (US)

(72) Inventors: Peter Agbo, Oakland, CA (US); Rebecca J. Abergel, Kensington, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 328 days.

(21) Appl. No.: 15/442,441

(22) Filed: Feb. 24, 2017

(65) Prior Publication Data

US 2017/0298272 A1    Oct. 19, 2017

Related U.S. Application Data

(60) Provisional application No. 62/300,613, filed on Feb. 26, 2016.

(51) Int. Cl.
H01L 31/00       (2006.01)
C09K 11/06       (2006.01)
C09K 11/77       (2006.01)
H01L 51/00       (2006.01)
H01L 31/055      (2014.01)
C09K 11/02       (2006.01)

(52) U.S. Cl.
CPC ............. *C09K 11/06* (2013.01); *C09K 11/02* (2013.01); *C09K 11/7791* (2013.01); *H01L 31/055* (2013.01); *H01L 51/0089* (2013.01);

*C09K 2211/1022* (2013.01); *C09K 2211/1029* (2013.01); *C09K 2211/182* (2013.01); *Y02E 10/52* (2013.01)

(58) Field of Classification Search
CPC .... H01L 51/0089; H01L 31/055; C09K 11/06
See application file for complete search history.

(56) References Cited

U.S. PATENT DOCUMENTS

| 4,278,559 | A | 7/1981 | Levenson et al. |
| 4,698,431 | A | 10/1987 | Raymond et al. |
| 4,891,075 | A | 1/1990 | Dakubu |
| 5,442,116 | A | 8/1995 | Welch et al. |
| 5,482,570 | A | 1/1996 | Saurer et al. |

(Continued)

FOREIGN PATENT DOCUMENTS

| EP | 0404097 B1 | 6/1990 |
| EP | 1755586 A2 | 2/2007 |

(Continued)

OTHER PUBLICATIONS

Liu et al., "A Strategy to Achieve Efficient Dual-Mode Luminescence of Eu3+ in Lanthanides Doped Multifunctional NaGdF4 Nanocrystals," Adv. Mater. 2010, 22, 3266-3271 (Year: 2010).*

(Continued)

*Primary Examiner* — Angelo Trivisonno
(74) *Attorney, Agent, or Firm* — Knobbe, Martens, Olson & Bear LLP

(57) ABSTRACT

Embodiments relate generally to lanthanide nanocrystals as ultraviolet downconverters.

18 Claims, 8 Drawing Sheets

(56) References Cited

U.S. PATENT DOCUMENTS

| | | | |
|---|---|---|---|
| 5,571,894 | A | 11/1996 | Wels et al. |
| 5,587,458 | A | 12/1996 | King et al. |
| 5,591,828 | A | 1/1997 | Bosslet et al. |
| 5,634,901 | A | 6/1997 | Alba et al. |
| 5,753,204 | A | 5/1998 | Huston et al. |
| 5,826,161 | A | 10/1998 | Madic et al. |
| 5,869,046 | A | 2/1999 | Presta et al. |
| 5,892,029 | A | 4/1999 | Raymond et al. |
| 6,843,917 | B1 | 1/2005 | Guy et al. |
| 6,846,915 | B2 | 1/2005 | Raymond et al. |
| 8,361,794 | B2 | 1/2013 | Jakobsen et al. |
| 8,475,747 | B1 | 7/2013 | Johnson et al. |
| 8,933,526 | B2 | 1/2015 | Tsakalakos et al. |
| 9,123,846 | B2 | 9/2015 | Le Perchec et al. |
| 9,472,694 | B2 | 10/2016 | Dionne et al. |
| 2002/0122752 | A1 | 9/2002 | Fukasawa et al. |
| 2005/0008570 | A1 | 1/2005 | Raymond et al. |
| 2009/0184051 | A1 | 7/2009 | Heres et al. |
| 2009/0320646 | A1 | 12/2009 | Yaita et al. |
| 2010/0015725 | A1* | 1/2010 | Raymond ............ C07D 213/89 436/501 |
| 2011/0250138 | A1 | 10/2011 | Fan et al. |
| 2012/0132277 | A1* | 5/2012 | Sulima .................. H01L 31/055 136/257 |
| 2012/0214843 | A1 | 8/2012 | Durbin-Harvey et al. |
| 2014/0235680 | A1 | 8/2014 | Bergeron et al. |
| 2016/0289223 | A1 | 10/2016 | Bergeron |
| 2016/0362491 | A1 | 12/2016 | Mudde et al. |
| 2017/0298272 | A1 | 10/2017 | Agbo et al. |
| 2019/0183868 | A1 | 6/2019 | Abergel et al. |
| 2019/0287691 | A1 | 9/2019 | Abergel et al. |
| 2019/0382470 | A1 | 12/2019 | Himmler et al. |
| 2021/0009510 | A1 | 1/2021 | Abergel et al. |

FOREIGN PATENT DOCUMENTS

| | | |
|---|---|---|
| EP | 3452040 A1 | 3/2019 |
| EP | 3509595 A1 | 7/2019 |
| EP | 3519034 A1 | 8/2019 |
| EP | 3520117 A2 | 8/2019 |
| JP | 2019-514944 A | 6/2019 |
| JP | 2019-532040 A | 11/2019 |
| JP | 2019-532182 A | 11/2019 |
| WO | WO 1993/01161 A1 | 1/1993 |
| WO | WO 1993/16185 A2 | 8/1993 |
| WO | WO 2006/028523 | 3/2006 |
| WO | WO 2006/072620 A1 | 7/2006 |
| WO | WO 2007/098934 A1 | 9/2007 |
| WO | WO 2010/129962 | 11/2010 |
| WO | WO 2015/077655 A1 | 5/2015 |
| WO | WO 2017/105565 | 6/2017 |
| WO | WO 2017/192581 A1 | 11/2017 |
| WO | WO 2018/048812 A1 | 3/2018 |
| WO | WO 2018/063638 A1 | 4/2018 |
| WO | WO 2018/097871 A3 | 5/2018 |

OTHER PUBLICATIONS

Abergel, R.J., et al. "Using the Antenna Effect as a Spectroscopic Tool; Photophysics and Solution Thermodynamics of the Model Luminescent Hydroxypyridonate Complex [EuIII(3,4,3-LI(1,2-HOPO))]," Inorg. Chem, vol. 48, No. 23, pp. 10868-10870, (2009).

Agbo et al., "Enhanced ultraviolet photon capture in ligand-sensitized nanocrystals," ACS Photonics, vol. 3, pp. 547-552, 2016.

Agbo et al., "Ligand-Sensitized Lanthanide Nanocrystals: Merging Solid-State Photophysics and Molecular Solution Chemistry," Inorg. Chem., vol. 55, No. 20, pp. 9973-9980, Jun. 30, 2016.

Banski, M. et al., "NaYF4 nanocrystals with TOPO ligands: synthesis-dependent structural and luminescent properties," Phys. Chem. Checm, Phys., vol. 15, No. 474, pp. 19232-19241, (2013).

Bünzlil, Jean-Claude G. "Lanthanide Luminescence for Biomedical Analyses and Imaging," Chem. Rev. vol. 110, No. 5, pp. 2729-2755, (2010).

Bünzlil, Jean-Claude G. et al. "Taking advantage of luminescent lanthanide ions," Chem. Soc. Rev., vol. 34, No. 12, pp. 1048-1077, (2005).

Chen, G. et al. "Core/Shell NaGdF4:Nd3+/NaGdF4 Nanocrystals with Efficient Near-Infrared to Near-Infrared Downconversion Photoluminescence for Bioimaging Applications," ACS Nano, vol. 6, No. 4, pp. 2969-2977, (2012).

Daumann, L.J., et al. "New Insights into Structure and Luminescence of Eu(III) and Sm(III) Complexes of the 3,4,3-Li(1,2-HOPO) Ligand," J. Am. Chem. Soc., vol. 137, pp. 2816-2819, (2015).

Jang, H.S. et al. "Bright dual-mode green emission from selective set of dopant ions in β-Na(Y,Gd)F4:Yb,Er/β-NaGdF4:Ce,Tb core/shell nanocrystals," Optics Express, vol. 20, No. 15, pp. 17107-17118, (2012).

Lakowicz, Joseph R., "Energy Transfer," Principles of Fluorescence Spectroscopy, pp. 367-394, (2006).

Lakshminarayana, G. et al. "Cooperative downconversion luminescence in Pr3+/Yb3+:SiO2—Al2O3—BaF2—GdF3 glasses," Journal of Materials Research, vol. 23, Issue 11, pp. 3090-3095, Nov. 2008.

Li, X. et al. "Engineering Homogeneous Doping in Single Nanoparticle to Enhance Upconversion Efficiency," Nano Lett., vol. 14, No. 6, pp. 3634-3639, (2014).

Li, C. et al. "Enhanced NIR downconversion luminescence by precipitating nano Ca5(PO4)3F crystals in Eu2+—Yb3+ co-doped glass," Spectrochimica Acta Part A: Molecular and Biomolecular Spectroscopy, vol. 114, pp. 575-578, Oct. 2013.

Li, X. et al. "Nd3+ Sensitized Up/Dovim Converting Dual-Mode Nanomaterials for Efficient In-vitro and In-vivo Bioimaging Excited at 800 nm," Scientific Reports, vol. 3, pp. 3536, (2013).

Liu, C. et al. "Morphology and Phase-Controlled Synthesis of Monodisperse Lanthanide-Doped NaGdF4 Nanocrystals with Multicolor Photo Luminsence," J. Mater. Chem., vol. 19, pp. 489-496, (2009).

Mimum, L. Christopher et al. "Bimodal imaging using neodymium doped gadolinium fluoride nanocrystals with near-infrared to near-infrared downconversion luminescence and magnetic resonance properties," Journals of Materials Chemistry B, vol. 1, pp. 5702-5710, 2013.

Moore, E.G., et al. "An octadentate luminescent Eu(III) 1,2-HOPO chelate with potent aqueous stability," Inorg. Chem., vol. 46, No. 14, pp. 5468-5470, (2007).

Pokhrel, M. et al. "Stokes emission inGdF3:Nd3+ nanoparticles for bioimaging probe," Nanoscale, vol. 6, No. 3, pp. 1667-1674, (2014).

Shockley, W. et al. "Detailed Balance Limit of Efficiency of p-n Junction Solar Cells," J Appl. Phys., vol. 32, No. 3, pp. 510-519, (1961).

Sturzbecher-Hoehne, M. et al. "A Step Towards New Curium Decontamination Strategies," Chem. Eur. J. , vol. 20, pp. 9962-9968, (2014).

Sturzbecher-Hoehne, M. et al. "3,4,3-LI(1,2-HOPO): In vitroformation of highly stable lanthanide complexes translates into efficacious in vlvoeuropium decorporation," Dalton Trans., vol. 40, No. 33, pp. 8340-8346, (2011).

Van Der Ende, B.M. et al., "Lanthanide ions as spectral converters for solar cells," Phys Chem Chem Phys, vol. 11, pp. 11081-11095, (2009).

Van Wijngaarden, J.T. et al. "Energy transfer mechanism for downconversion in the (Pr3+, Yb3+) couple," Phys. Rev. B, vol. 81, Issue 15, pp. 155112, Apr. 15, 2010.

Wang, Z.L. et al. "Down- and up-conversion photoluminescence, cathodoluminescence,and paramagnetic properties of NaGdF4 : Yb3+,Er3+ submicron disks assembled from primary nanocrystals," Journal of Materials Chemistry, Issue 16, pp. 3178-3185, (2010).

Wang, F. et al. "Preparation of Core-Shell NaGdF4 Nanoparticles Doped with Luminescent Lanthanide Ions to be Used as Upconversion-Based Probes," Nature Protocols, vol. 9, No. 7, pp. 1634-1644, (2014).

Wawrzynczyk, D. et al. "Ligand-dependent luminescence of ultrasmall Eu3+-doped NaYF4 nanoparticles," J. Nanopart Res., vol. 15, pp. 1707, (2013).

Ye, S. et al. "Down conversion luminescence of Tb3+—Yb3+ codoped SrF2 precipitated glass ceramics," Journal of Non-Crystalline Solids, vol. 357, Issues 11-13, pp. 2268-2271, Jun. 2011.

(56) References Cited

OTHER PUBLICATIONS

Ye, S. et al. "Enhanced cooperative quantum cutting in Tm3+—Yb3+ codoped glass ceramics containing LaF3nanocrystals," Optics Express, vol. 16, No. 12, pp. 8989-8994, Jun. 9, 2008.

Zou, W. et al. "Broadband dye-sensitized upconversion of near-infrared light," Nature Photonics, vol. 6, pp. 560-564, Aug. 2012.

Zhu, W et al. "An active-core/active-shell structure with enhanced quantum-cutting luminescence in Pr—Yb co-doped monodisperse nanoparticles," Nanoscale, vol. 6, pp. 10500-10504, (2014).

Abergel, et al. Biomimetic Actinide Chelators: An Update on the Preclinical Development of the Orally Active Hydroxypyridonate Decorporation Agents 3,4,3-L/(1,2-HOPO) and 5-LIO(Me-3,2-HOPO). Health Physics, vol. 99, No. 3, pp. 401-417, 2010.

Abergei, et al., Multidentate Terephthalamidate and Hydroxypyridonate Ligands: Towards New Orally Active Chelators, Hemoglobin, vol. 35, No. 3, pp. 276-290, 2011.

Agency for Toxic Substances and Disease Registry (ATSDR), Toxicological profile for Plutonium. 2010, U.S. Department of Health and Human Services, Public Health Service: Atlanta, GA.

Alderighi, et al., Hyperquad Simulation and Speciation (HySS): A Utility Program for the Investigation of Equilibria Involving Soluble and Partially Soluble Species, Coordination Chemistry Reviews, vol. 184, pp. 311-318, 1999.

Allred, B. et al. Siderocalin-mediated recognition, sensitization, and cellular uptake of actinides. Proceedings of the National Academy of Sciences of the United States of America, vol. 112, pp. 10342, 2015.

An, et al., Elimination Profiles After Delayed Treatment With 3,4,3L/(1,2HOPO) in Female and Male Swiss-Webster Mice. International Journal of Radiation Biology, vol. 90, No. 11, pp. 1055-1061, 2014.

An, et al., From Early Prophylaxis to Delayed Treatment: Establishing the Plutonium Decorporation Activity Window of Hydroxypyridinonate Chelating Agents, Chemico-Biological Interactions, Elsevier Science Ireland, IR, vol. 267, pp. 80-88, 2016.

Ansari, et al., Extraction of actinides using N, N,N , N-Tetraoctyl Diglycolamide (TODGA): A Thermodynamic Study Radiochimica. Acta Journal, vol. 94, pp. 307-312, 2006.

Ansari, et al., N,N,N',N'-Tetraoctyl Diglycolamide (TODGA): A Promising Extractant for Actinide-Partitioning from High-Level Waste (HLW), Solvent Extraction and Ion Exchange, pp. 463-479, 2006.

Antonio, M. et al., Berkelium redox speciation, Radiochim. Acta, vol. 90, pp. 851-856, (2006).

Argonne National Laboratory Division of Biological and Medical Research, Annual Report, Argonne National Laboratory. Division of Biological and Medical Research: Argonne, Illinois. 1979.

Baco, et al., Diphenyl-Benzo[1,3]dioxole-4-Carboxylic Acid Pentafluorophenyl Ester: A Convenient Catechol Precursor in the Synthesis of Siderophore Vectors Suitable for Antibiotic Trojan Horse Strategies, Organic and Biomolecular Chemistry, vol. 12, pp. 749, 2014.

Banker, et al., Pharmaceutics and Pharmacy Practice, pp. 238-250, 1982.

Baral, T. et al., Experimental Therapy of African Trypanosomiasis With a Nanobody-Conjugated Human Trypanolytic Factor, Nature Medicine, vol. 12, pp. 580-584, 2006.

Barthelemy, et al., Journal of Biological Chemistry, pp. 3283-3639, 2008.

Baybarz, et al. Absorption Spectra of Bk(III) and Bk(IV) in Several Media, Journal of Inorganic and Nuclear Chemistry, Vo. 34, pp. 739-746, 1972.

Bhattacharyya, M. et al., Action of DTPA on Hepatic Plutonium: III. Evidence for a Direct Chelation Mechanism for DTPA-Induced Excretion of Monomeric Plutonium into Rat Bile, Radiation Research, vol. 80, pp. 108-115, 1979.

Binz, et al., Engineering Novel Binding Proteins From Nonimmunoglobulin Domains, Nature Biotechnology, vol. 23, pp. 1257-1268, 2005.

Bird, et al., Single-chain antigen-binding proteins, Science, vol. 242, No. 4877, pp. 423-426, 1988.

Boersma, et al., DARPins and Other Repeat Protein Scaffolds: Advances in Engineering and Applications, Current Opinion in Biotechnology, vol. 22, No. 4, pp. 849-857, 2011.

Bunin, et al., Dose-Dependent Efficacy and Safety Toxicology of Hydroxypyridinonate Actinide Decorporation Agents in Rodents: Towards a Safe and Effective Human Dosing Regimenm Radiation Research, vol. 179, No. 2, pp. 171-182, 2013.

Carnall, et al., A Systematic Analysis of the Spectra the Trivalent Actinide Chlorides in D3h Site Symetry, Argonne National Laboratory, Argonne , Illinois, USA, 1989.

Carott, et al., Distribution of plutonium, americium and interfering fission products between nitric acid and a mixed organic phase of TODGA and DMDOHEMA in kerosene, and implications for the design of the "EURO-GANEX" process, Hydrometallurgy, vol. 152, pp. 139-148, 2015.

Carrot, et al. Neptunium Extraction and Stability in the GANEX Solvent: 0.2 M TODGA/0.5 M DMDOHEMA/ Kerosene, Solvent Extraction and Ion Exchange, 2012.

Captain, et al., Engineered Recognition of Tetravalent Zirconium and Thorium by Chelator—Protein Systems: Toward Flexible Radiotherapy and Imaging Platforms, Inorganic Chemistry, vol. 55, pp. 11930-11936, 2016.

Cassatt, et al., Medical Countermeasures Against Nuclear Threats: Radionuclide Decorporation Agents., Radiation Research, vol. 170, No. 4, pp. 540-548, 2008.

Chang, et al., Analytical Methods for the Bioavailability Evaluation of Hydroxypyridinonate Actinide Decorporation Agents in Pre-Clinical Pharmacokinetic Studies, Journal Chromatography Separation Technique Journal, 2012.

Choi, et al., Biodistribution of the Multidentate Hydroxypyridinonate Ligand [(14)CJ-3,4,3-L/(1,2-HOPO), A Potent Actinide Decorporation Agent, Drug Development Research, vol. 76, No. 3, pp. 107-122, 2015.

Choi, et al., In vitro metabolism and stability of the actinide chelating agent 3,4,3-Lf {1,2-I-/OPO). Journal of pharmaceutical sciences, vol. 104, No. 5, pp. 1832-1838, 2015.

Choi, et al., Understanding the Health Impacts and Risks of Exposure to Radiation, in Reflections on the Fukushima Daiichi Nuclear Accident, Chemical Sciences Division, Lawrence Berkeley National Laboratory, pp. 259-281, 2015.

Chudinov, et al., The separation of berkelium (III) from cerium (III), Journal of Radioanalytical and Nuclear Chemistry, vol. 10, pp. 41-46, 1972.

Cortez-Retamozo, V. et al., Efficient Cancer Therapy with a Nanobody-Based Conjugate, Cancer Research, vol. 64, pp. 2853-2857, 2004.

Cotton, et al., Wiley, 2006. http://www.wiley.com/WileyCDA/WileyTitle/productCd-0470010053.html.

Deblonde, et al., A New Strategy for the Purification of Heavy Actinides and Medical Radioisotopes, Advanced Techniques in Actinide Spectroscopy, 2018.

Deblonde, et al., Chelation and stabilization of berkelium in oxidation state +IV, Nature Chemistry, vol. 9, pp. 843-849, 2017.

Deblonde, et al., Complexation, Characterization and Separation of the Lanthanides and Actinides: Shedding Light to Subtle Differences within the f-element Series, Actinides and Rare Earths Focus Topic, 2018.

Deblonde, et al., Solution Thermodynamic Stability of Complexes Formed with the Octadentate Hydroxypyridinonate Ligand 3,4,3-L1(1,2-HOPO): A Critical Feature for Efficient Chelation of Lanthanide(IV) and Actinide(IV) Ions, Inorganic Chemistry, vol. 52, pp. 8805-8811, 2013.

Deblonde, et al., 1387—Hydropyridinonate ligands: From iron(III) to berkelium(IV) chemistry, Abstract.

Deblonde, et al., Inducing Selectivity and Chirality in Group IV Metal Coordination With High-Denticity Hydroxypyridinones\, Dalton Transactions, No. 23, 2019.

Deblonde, et al., Solution Thermodynamics and Kinetics of Metal Complexation with a Hydroxypyridinone Chelator Designed for Thorium-227 Targeted Alpha Therapy, Inorganic Chemistry, vol. 57, pp. 14337-14346, 2018.

(56) References Cited

OTHER PUBLICATIONS

Deblonde, et al., Solution thermodynamics of hydropyridinonate 4f and 5f complexes, 28th Rare Earth Research Conference, 2017.

Deblonde, et al., Toxic heavy metal-Pb, Cd, Sn-complexation by the octadentate hydroxypyridinonate ligand archetype 3,4,3-LI(1,2-HOPO)†, New Journal of Chemistry, vol. 42, pp. 7649-7658, 2018.

Deblonde, et al., Ultra-selective Ligand-driven Separation of Strategic Actinides, Nature Communications, 2019.

Deblonde, et al., Inorganic chemistry, vol. 52, No. 15, pp. 8805-8811,2013.

Delmau, et al., Extraction of Trivalent Actinides and Lanthanides from Californium Campaign Rework Solution Using TODGA-based Solvent Extraction System, Oak Ridge National Laboratory, 2017.

Deri, et al., Alternative Chelator for 89Zr Radiopharmaceuticals: Radiolabeling and Evaluation of 3,4,3-(LI-1,2-HOPO), Journal of Medicinal Chemistry, vol. 57, No. 11, pp. 4849-4860, 2014.

Deri, et al., Bioconjugate Chemistry, vol. 26, No. 12, pp. 2579-2591, 2015.

Deri, et al., A Superior Bifunctional Chelator for 89Zr ImmunoPET, Bioconjugate Chemistry, vol. 26, No. 12, pp. 2579-2591, 2015.

Designing a Process for Selecting a Site for a Deep-Mined, Geologic Repository for High Level Radioactive Waste and Spent Nuclear Fuel, United States Nuclear Waste Technical Review Board, pp. 1-228, 2015.

Durbin, et al. Actinides in Animals and Man, in the Chemistry of the Actinide and Transactinide Elements, L.R. Morss, N.M. Edelstein, and J. Fuger, Editors, pp. 3339-3340, 2006.

Durbin, et al., Gross Composition and Plasma and Extracellular Water Volumes of Tissues of a Reference Mouse, Health Physics, vol. 63, No. 4, pp. 427-442, 1992.

Durbin, et al., Lecture: The Quest for Therapeutic Actinide Chelators, Health Physics, vol. 95, No. 5, pp. 465-492, 2008.

Dutta, et al., Studies on separation of 90Y and 90Sr separation from hydrochloric acid solutions using TODGA as the extractant by SLM method, Procedia Chemistry, vol. 7, pp. 191-194, 2012.

Fritsch, et al., Simplified Structure of a New Model to Describe Urinary Excretion of Plutonium After Systemic, Liver or Pulmonary Contamination of Rats Associated With Ca-DTPA Treatments, Radiation Research, vol. 171, No. 6, pp. 674-686, 2009.

Fritsch, et al., Structure of a Single Model to Describe Plutonium and Americium Decorporation by DTPA treatments, Health Physics, vol. 99, No. 4, pp. 553-559, 2010.

Gans, et al., Investigation of Equilibria in Solution. Determination of Equilibrium Constants with the Hyperquad Suite of Programs, Talanta, vol. 43, pp. 1739-1753, 1996.

Gennaro, et al., Remington: The Science and Practice of Pharmacy, 20th ed, 2003.

Goetz, et al., The Neutrophil Lipocalin NGAL Is a Bacteriostatic Agent That Interferes With Siderophore-Mediated Iron Acquisition, Molecular Cell, vol. 10, pp. 1033-1043, 2002.

Gorden, et al., Rational Design of Sequestering Agents for Plutonium and Other Actinides, Chemical Reviews, vol. 103, pp. 4207-4282, 2003.

Grappin, et al., Treatment of actinide exposures: A review oJCa-DTPA injections inside CEA-COGEMA plants, Radiation Protection Dosimetry, vol. 127, pp. 435-439, 2007.

Gregoric, et al., Characterization and Leaching of Neodymium Magnet Waste and Solvent Extraction of the Rare-Earth Elements Using TODGA, Journal of Sustain. vol. 3, pp. 638-645, 2017.

Grimes, et al., Trivalent Lanthanide/Actinide Separation Using Aqueous-Modified TALSPEAK Chemistry, Solvent Extraction and Ion Exchange, vol. 32, No. 4, pp. 378-390, 2014.

Gutmacher, et al., The absorption spectra of Bk3+ and Bk4+ in solution, Journal of Inorganic and Nuclear Chemistry, vol. 29, pp. 2341-2345, 1967.

Gutmacher, et al., Stability of Tetravalent Berkelium in Acid Solution and the Absorption Spectra of Bk(IV) and Bk(III), Journal of Inorganic and Nuclear Chemistry, pp. 979-994, 1973.

Harvey, Production of Actinium-225 via High Energy Proton Induced Spallation of Thorium-232. Final Technical Report DE-SC0003602, NorthStar Medical Radioisotopes, LLC, https://world wide web .osti.gov/scitech/servlets/purl/1032445/).

Hobart, et al., The Chemistry of the Actinide and Transactinide Elements—Chapter X—Berkelium, Springer, 2006.

Hoet, et al., Generation of High-Affinity Human Antibodies by Combining Donor-Derived and Synthetic Complementarity-Determining-Region Diversity, Nature Biotechnology, vol. 23, pp. 344-348, 2005.

Holliger, et al., Diabodies: small bivalent and bispecific antibody fragments, Proceedings of the National Academy of Sciences of the USA, vol. 90, pp. 6444-6448, 1993.

Hudson, et al., Engineered antibodies, Nature Medicine, vol. 9, pp. 129-134, 2003.

Husain, et al., Extraction chromatography of lanthanides using N,N,N',N'-tetraoctyl diglycolamide (TODGA) as the stationary phase, Desalination, vol. 229, pp. 294-301, 2008.

Huston, et al., Protein Engineering of Antibody Binding Sites: Recovery of Specific Activity in an Anti-Digoxin Single-Chain Fv Analogue Produced in *Escherichia coli*, Proceedings of the National Academy of Sciences of the USA, vol. 85, pp. 5879-5883, 1988.

Iqbal, et al., Synthesis and Am/Eu extraction of novel TODGA derivatives, Supramolecualr Chemistry, vol. 22, pp. 827-837, 2010.

Jarvis, et al., Significance of Single Variables in Defining Adequate Animal Models to Assess the Efficacy of New Radionuclide Decorporation Agents: Using the Contamination Dose as an Example. Drug Development Research, vol. 73, No. 5, pp. 281-299, 2012.

Burgaada, et al., Journal of Labelled Compounds and Radiopharmaceuticals, vol. 44, pp. 13-19, 2001.

Jursich, et al., Laser induced fluorescence of 249 Bk 4+ in CeF 4, Inorganica Chim. Acta. vol. 139, pp. 273-274. 1987.

Konzen, et al, Development of the Plutonium-DTPA Biokinetic Model. Health Physics, vol. 108, No. 6, pp. 565-573, 2015.

Kurkoti, et al., Gadolinium and nephrogenic systemic fibrosis: Association or causation. 1-10 Nephrology, vol. 13, pp. 235-241, 2008.

Kullgren, et al., Actinide Chelation: Biodistribution and in Vivo Complex Stability of the Targeted Metal Ions, Toxicology Mechanisms and Methods, vol. 23, No. 1, pp. 18-26, 2013.

Lake, et al., Construction and Binding Analysis of Recombinant Single-Chain TCR Derived From Tumor-Infiltrating Lymphocytes and a Cytotoxic T Lymphocyte Clone Directed Against MAGE-1, International Immunology, Vo. 11, pp. 745-751, 1999.

Liu, et al. A Stratgey to Achieve Efficent Dual-Mode Luminscence of EU3+ in Lanthanides Doped Multifunctional NAGdF4 Nanocrystals, Adv Matter, vol. 22, pp. 3266-3271, 2010.

Liu et al., Procedures for a fast separation of berkelium from complex mixtures of reaction products, J. Radioanal. Nucl. Chem. 76, pp. 119-124, 1983.

Lohithakshan, et al., Solvent extraction studies of plutonium(IV) and americium(III) in room temperature ionic liquid (RTIL) by di-2-ethyl hexyl phosphoric acid (HDEHP) as Extractant, Journal of Radioanalytical and Nuclear Chemistry, vol. 301, pp. 153-157, 2014.

Loomis, et al., Inorganic Chemistry, vol. 30, No. 5, pp. 906-911, 1991.

Lumetta, et al., An Advanced TALSPEAK Concept Using 2-Ethylhexylphosphonic Acid Mono-2-Ethylhexyl Ester as the Extractant, Solvent Extraction and Ion Exchange, vol. 33, No. 3, pp. 211-223, 2015.

Lundberg, et al., Structural Study of the N,N'-Dimethylpropyleneurea Solvated Lanthanoid(III) Ions in Solution and Solid State with an Analysis of the Ionic Radii of Lanthanoid(III) Ions, Inorganic Chemistry, vol. 49, pp. 4420-4432, 2010.

Lundberg, et al., The size of actinoid(III) ions—structural analysis vs. common misinterpretations, Coordination Chemistry Reviews, vol. 318, pp. 131-134, 2016.

Martell, et al., NIST Standard Reference Database; National Institute of Standards and Technology: Gaithersburg, MD.

Maynard, et al., High-Level Bacterial Secretion of Single-Chain Aβ T-Cell Receptors, Journal of Immunological Methods, vol. 306, pp. 51-67, 2005.

(56) References Cited

OTHER PUBLICATIONS

Milyukova, et al. Extraction of Bk(IV) with POM—Milyukova, 1986.pdf, J. Radioanal. Nucl. Chem. 104 pp. 81-90, (1986).

Modolo, et al., Recovery of Actinides and Lanthanides From High-Level Liquid Waste by Extraction Chromatography Using TODGA+TBP Impregnated Resins, Radiochimica Acta, vol. 95, pp. 391-397, 2007.

Modolo, et al., Development of a TODGA based Process for Partitioning of Actinides from a PUREX Raffinate Part I: Batch Extraction Optimization Studies and Stability Tests, Solvent Extraction and Ion Exchange, 2007.

Moore, et al., Application of dual affinity retargeting molecules to achieve optimal redirected T-cell killing of B-cell lymphoma, Blood, Vo. 117, pp. 4542-4551, 2011.

Moore, et al. Liquid-liquid Extraction Method for the Separation of Cerium (IV) From Berkelium (IV) and Other Elements, Analytical Chemistry, vol. 41, pp. 1658-1661, 1969.

Moore, et al., New Method for Rapid Separation of Berkelium (IV) From Cerium (IV) by Anion Exchange, Analytical Chemistry, vol. 39, pp. 1874-1876, 1967.

Moos, et al., Radiation Drugs—A Hot Topic. Drug Development Research, vol. 73, No. 5, pp. 229-231, 2012.

Morita, et al. Development of Todga Extraction Process for High-Level Liquid Waste—Preliminary Evaluation of Actinide Separation by Calculation, 2000.

Morris, et al., Voltammetric Investigation of the Berkelium(IV/III) Couple in Concentrated Aqueous Carbonate Solutions, Radiochimica Acta, pp. 125-134, 1990.

Morss et al., The Chemistry of the Actinide and Transactinide Elements, 4th ed, Springer,(2010).

Nash, et al., The Chemistry of TALSPEAK: A Review of the Science, Solvent Extraction. Ion Exchange Journal, vol. 33, No. 1, pp. 1-55, 2015.

NCRP, Management of Persons Contaminated with Radionuclides: Handbook, in NCRP Publication. 2008: Bethesda.

Nord, et al., A combinatorial library of an α-helical bacterial receptor domain, Protein Engineering, Design and Selection, vol. 8, No. 6, pp. 601, 1995.

Nord, et al., Binding proteins selected from combinatorial libraries of an α-helical bacterial receptor domain, Nature Biotechnology, vol. 15, pp. 772-777, 1997.

Nord, et al., Recombinant human factor VIII-specific affinity ligands selected from phage-displayed combinatorial libraries of protein A, European Journal of Biochemistry, vol. 268, pp. 4269-4277, 2001.

Nugent, et al., Electron-transfer and fd Absorption Bands of Some Lanthanide and Actinide Complexes and the Standard (II-III) Oxidation Potential for Each Member of the Lanthanide and Actinide Series, The Journal of Physical Chemistry A, vol. 77, pp. 1528-1539, 1973.

Nugent, et al., Intramolecular Energy Transfer and Sensitized Luminescence in Actinide (III). Beta.-Diketone Chelates, The Journal of Physical Chemistry A, vol. 73, pp. 1540-1549, 1969.

Ostapenko, et al., Extraction Chromatographic Behavior of Actinium and REE on DGA, Ln and TRU Resins in Nitric Acid Solutions, Journal of Radioanalytical and Nuclear Chemistry, vol. 306, pp. 707-711, 2015.

Oxford Dictionary of Biochemistry and Molecular Biology Ed. Anthony Smith, Oxford University Press, Oxford, 2004.

Parker, S et al., The McGraw-Hill Dictionary of chemical Terms, 1985.

Payne, et al. Possible Stabilization of the Tetravalent Oxidation State of Berkelium and Californium in Acetonitrile With Triphenylarsine Oxide, Inorganica Chimica Acta, vol. 139 , pp. 111-112, 1987.

Peppard, et al. Isolation of Berkelium by Solvent Extraction of the *Tetravalent* Species, Journal of Inorganic and Nuclear Chemistry, vol. 4, pp. 344-348, 1957.

Pham, et al., A Macrocyclic Chelator with Unprecedented Th4+ Affinity, Journal of the American Chemical Society, vol. 136, No. 25, pp. 9106-9115, 2014.

Plueckthon The Pharmacology of Monoclonal Antibodies, vol. 113, Rosenburg and Moore, 269-315, 1994.

Pourmand, et al., Distribution coefficients of 60 elements on TODGA resin: Application to Ca, Lu, Hf, U and Th isotope geochemistry, Talanta, vol. 81, pp. 741-753, 2010.

Radchenko et al., Application of Ion Exchange and Extraction Chromatography to the Separation of Actinium From Proton-Irradiated Thorium Metal for Analytical Purposes, Journal of Chromatography, pp. 55-63, 2015.

Remington's Pharmaceutical Sciences, 18th Ed. Mack Printing Company, 1990.

Ricano, et al. Combinatorial Design of Multimeric Chelating Peptoids for Selective Metal Coordination, Chemical Science, 2019.

Shannon, et al., Revised Effective Ionic Radii and Systematic Studies of Interatomic Distances in Halides and Chalcogenides, Acta Crystallographica A32, pp. 751-757, 1976.

Smith, et al., NIST Critically selected stability constants of metal complexes database, NIST standard reference database, 2004.

Stather, et al., Use of DTPAfor increasing the rate of elimination ofplutonium-238 and americium-241from rodents after their inhalation as the nitrates, Human & Experimental Toxicology, vol. 4, No. 6, pp. 573-582, 1985.

Stockley, et al., Absorption Spectra of the Bk(IV)-Bk(III) in several media, Journal of Inorganic and Nuclear Chemistry, vol. 34, pp. 739-746, 1972.

Sturzbecher-Hoehne, et al., Highly Luminescent and Stable Hydroxypyridinonate Complexes: A Step Towards New Curium Decontamination Strategies, Chemistry—A European Journal, vol. 20, No. 32, pp. 9962-9968, 2014.

Sturzbecher-Hoehne, et al., Hydroxypyridinonate Complex Stability of Group (IV) Metals and Tetravalent f-Block Elements: The Key to the Next Generation of Chelating Agents for Radiopharmaceuticals, Inorganic chemistry, vol. 54, No. 7, pp. 3462-3468, 2015.

Sturzbecher-Hoehne, et al Intramolecular Sensitization of Americium Luminescence in Solution: Shining Light on Short-Lived Forbidden 5f Transitions, Dalton Transactions, vol. 45, pp. 9912-9919, 2016.

Sturzbecher-Hoehne, et al., Solution Thermodynamic Evaluation of Hydroxypyridinonate Chelators 3,4,3-LI(1,2-HOPO) and 5-LIO(Me-3,2-HOPO) for UO2(VI) and Th(IV) Decorporation, Radiochimica Acta, vol. 101,No. 6, pp. 359-366, 2013.

Suzuki, et al., Extraction and separation of Am(III) and Sr(II) by N,N,N ,N-tetraoctyl-3-oxapentanediamide (TODGA), Radiochimica Acta vol. 92, pp. 463-466, 2004.

Tachimori, et al. Modification of TODGA-N-Dodecane Solvent With a Monoamide for High Loading of Lanthanides(III) and Actinides(III), Solvent Extraction and Ion Exchange, 2007.

Taylor, et al., Treatment of Human Contamination With Plutonium and Americium: Would Orally Administered Ca- or Zn-DTPA be effective? Radiation Protection Dosimetry, vol. 127, pp. 469-471, 2007.

Thompson, et al, Element 97, Physics Review, vol. 77, pp. 838, 1950.

Thompson, et al, Chemical properties of Berkelium, Journal of the American Chemical Society, vol. 72, pp. 2798-2801, 1950.

Trissel, L. et al., ASHP Handbook on Injectable Drugs 4th ed, pp. 622-630, 1986.

Turanov, et al., Synergistic Extraction of U(VI), Th(IV), and Lanthanides(III) from Nitric Acid Solutions Using Mixtures of TODGA and Dinonylnaphthalene Sulfonic Acid, Solvent Extraction and Ion Exchange, 2018.

Umeda, et al., Separation of Americium from Plutonium-Solvent Extraction Raffinate by Extraction Chromatography using TODGA Absorbent, Atlantate, 2004.

U.S. Food and Drug Administration, Guidance for Industry Calcium DTPA and Zinc DTPA Drug Products—Submitting a New Drug Application. 2004.

US. Food and Drug Administration, Guidance for Industry Internal Radioactive Contamination—Development of Decorporation Agents. 2006.

U.S. Food and Drug Administration, Guidance for Industry Product Development Under the Animal Rule 2015.

(56) References Cited

OTHER PUBLICATIONS

U.S. Food and Drug Administration, Approval of New Drugs When Human Efficacy Studies Are Not Ethical or Feasible. 2015, U.S. FDA: Washington, DC.
Wadsworth, et al., Present Status of Cerium (IV)-Cerium (III) Potentials, Analytical Chemistry, vol. 29, pp. 1824-1825, 1957.
Wai, et al., Carboxylate-Derived Calixarenes With High Selectivity for Actinium-225, Chemical Communications pp. 377-378, 1998.
Wang, et al. Extraction of Trivalent Americium and Europium With TODGA Homologs From HNO3 Solution, Journal of Radioanalytical and Nuclear Chemistry, vol. 313, pp. 309-318, 2017.
Weidle et al., The Emerging Role of New Protein Scaffold-based Agents for Treatment of Cancer, Cancer Genomics and Proteomics. vol. 10, pp. 155, 2013.
Weitl, et al., Specific sequestering agents for the actinides. 3. Polycatecholate ligands derived from 2,3-dihydroxy-5-sulfobenzoyl conjugates of diaza- and tetraazaalkanes, Journal of the American Chemical Society, vol. 102. No. 7, pp. 2289-2293, 1980.
Welcher, F. J. The analytical uses of ethylenediamine tetraacetic acid; 1958.
Wermuth, C. et al., Designing Prodrugs and Bioprecursors, pp. 561-586, 2003.
Whitaker, et al., Applications of Diglycolamide Based Solvent Extraction Processes in Spent Nuclear Fuel Reprocessing, Part 1: Todga, Solvent Extraction and Ion Exchange, 2018.
Whitcomb, et al., A Public Health Perspective on the U.S. Response to the Fukushima radiological emergency. Health Phys, vol. 108, No. 3, pp. 357-363, 2015.
White, et al., Specific Sequestering Agents for the Actinides. 16. Synthesis and Initial Biological Testing of Polydentate Oxohydroxypyridinecarboxylate Ligands, Journal of Medicinal Chemistry, vol. 31, No. 1, pp. 11-18, 1988.
Wilden, A. et al. Unprecedented Inversion of Selectivity and Extraordinary Difference in the Complexation of Trivalent f-Elements by Diastereomers of a Methylated Diglycolamide, Chemistry a European Journal, 2019.
Xu, et al., Specific Sequestering Agents for the Actinides. 28. Synthesis and Initial Evaluation of Multidentate 4-Carbamoyl-3-hydroxy-1-methyl-2(1H)-pyridinone Ligands for in Vivo Plutonium (IV) Chelation, Journal of Medicinal Chemistry, vol. 38, No. 14, pp. 2606-2614, 1988.
Yantasee, et al., Novel Sorbents for Removal of Gadolinium-Based Contrast Agents in Sorbent Dialysis and Hemoperfusion: Preventive Approaches to Nephrogenic Systemic Fibrosis (NSF), Nanomedicine, vol. 6, No. 1, pp. 1-8, 2010.
Zhang et al, Novel Enterobactin Analogues As Potential Therapeutic Chelating Agents: Synthesis, Thermodynamic and Antioxidant Studies, Scientific Reports, vol. 6, pp. 1-12, 2016.
Zhu, X et al. Cumulative study on solvent extraction of elements by N,N,N ,N-tetraoctyl-3-oxapentanediamide (TODGA) from nitric acid into n-dodecane, Analytica Chimica Acta 527, pp. 163-168, 2004.
International Preliminary Report on Patentability dated Nov. 6, 2018 in International Patent Application No. PCT/US2017/030628.
International Preliminary Report on Patentability dated Mar. 12, 2019 in International Patent Application No. PCT/US2017/050121.
International Preliminary Report on Patentability dated Apr. 11, 2019 in International Patent Application No. PCT/US2017/048910.
International Preliminary Report on Patentability dated Apr. 11, 2019 in International Patent Application No. PCT/US2017/048934.
International Search Report and Written Opinion dated Jul. 27, 2017 in International Patent Application No. PCT/US2017/030628.
International Search Report and Written Opinion dated Nov. 13, 2017 in International patent application PCT/US2017/050121.
International Search Report dated Dec. 21, 2017 in International Patent Application No. PCT/US2017/048910.
International Search Report dated May 11, 2018 in International Patent Application No. PCT/US2017/048934.
Office Action dated Nov. 21, 2018 in U.S. Appl. No. 15/442,441.
Office Action dated May 6, 2019 in U.S. Appl. No. 15/442,441.
Office Action dated Aug. 23, 2019 in U.S. Appl. No. 15/442,441.
Supplementary European Search Report, dated Nov. 15, 2019, in European Application No. EP 17793154.
Sam II, AD et al. Safety of gadolinium contrast angiography in patients with chronic renal Insufficiency Journal of Vascular Surgery, vol. 38, pp. 313-318, (2003).
European Extended Search Report, re Application No. 17793154. 0-1112/ 3452040, PCT/US2017030628, dated Nov. 21, 2019.
Supplementary Partial European Search Report, re Application No. 17873523.9, dated May 27, 2020.
Office Action dated Jun. 25, 2019 in U.S. Appl. No. 16/097,782.
Office Action dated Oct. 15, 2019 in U.S. Appl. No. 16/097,782.
Office Action dated Mar. 10, 2020 in U.S. Appl. No. 16/097,782.
Extended European Search Report dated Mar. 24, 2020 in European App. No. 17849400.1.
Durbin, P. et al., Octadentate catecholamide ligands for Pu (IV) based on linear or preorganized molecular backbones, Human Toxicology, vol. 15, No. 4, pp. 352-360, 1996.
Uhlir, Linda et al., "Specific sequestering agents for the actinides. 21. Synthesis and initial biological testing of octadentate mixed catecholate-hydroxypyridinonate ligands", Journal of Medicinal Chemistry, vol. 36, No. 4, pp. 504-509, 1993.
Office Action dated Jul. 22, 2020 in U.S. Appl. No. 16/097,782.
European Search Report, re Application No. 17873523.9, dated Aug. 27, 2020.
Supplementary Partial European Search Report, re Application No. 17857076.8, dated Oct. 7, 2020.
Extended European Search Report dated Jan. 19, 2021 in Application No. 17857076.8.

\* cited by examiner

DIRECT EXCITATION OF EU(III) IN $NAGD_{0.95}EU_{0.05}F_4$ NANOCRYSTALS

TIME-RESOLVED EMISSION OF 3,4,3-LI(1,2-HOPO) AT 525 NM IN ETHANOL GLASS AT 77 K.

TEM IMAGES OF NANOCRYSTALS $NaGd_{0.95}Eu_{0.05}F_4$ nanoparticles before ligand modification

TEM IMAGES OF NANOCRYSTALS

LIGAND-SENSITIZED LANTHANIDE NANOCRYSTALS AS ULTRAVIOLET DOWNCONVERTERS

STATEMENT REGARDING FEDERALLY SPONSORED R&D

The invention described was made in part utilizing funds supplied by the U.S. Department of Energy under Contract No. DE-AC02-05CH11231. The government has certain rights in this invention.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The invention relates to lanthanide nanocrystals as ultraviolet downconverters.

Description of the Related Art

The fields of photo up- and down-conversion have risen largely in response to increasing global energy demands. In these schemes, the range (bandwidth) of incident solar radiation usable by silicon solar cells is expanded by coupling traditional photovoltaics with materials capable of absorbing light in regions where Si photocurrent response is lowest, and re-emitting the energy as photons with energies on par with the bulk Si band-gap (~1000 nm).

SUMMARY

In some embodiments, a light conversion material is provided that comprises a lanthanide nanocrystal and a HOPO containing chelator.

In some embodiments, a photovoltaic cell is provided that comprises a lanthanide nanocrystal and a HOPO containing chelator.

In some embodiments, a nanocrystal is provided that comprises a $NaGd_{1-x}Eu_xF_4$ nanocrystal and a 3,4,3-LI(1,2-HOPO) ligand.

In some embodiments, a method of downconverting light from UV to visible light or its equivalent energy is provided that comprises illuminating a 3,4,3-LI(1,2-HOPO) ligand with UV radiation such that the ligand absorbs energy in the UV spectrum and transfers energy to $NaGd_{1-x}Eu_xF_4$.

In some embodiments, a nanoparticle is provided that comprises a core, wherein the core comprises a first lanthanide and Yb and a shell coating the core. The shell is doped with a second lanthanide. The shell comprises 3,4,3-LI(1,2-HOPO). The first lanthanide and the second lanthanide are a same lanthanide.

In some embodiments, a method of producing two-photon emission is provided. The method comprises providing a nanoparticle as described herein, irradiating the HOPO associated with the surface of the nanoparticle (e.g., 3,4,3-LI(1,2-HOPO)), transferring energy from 3,4,3-LI(1,2-HOPO) to the second lanthanide, transferring energy from the second lanthanide to the first lanthanide, transferring energy from the first lanthanide to Yb. The first lanthanide and the second lanthanide are a same lanthanide. The method further comprising emitting two photons from Yb a photon that excited 3,4,3-LI(1,2-HOPO).

In some embodiments, the compositions are to be used as an addition to photovoltaic cells as they currently exist, in order to improve their efficiency.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1:
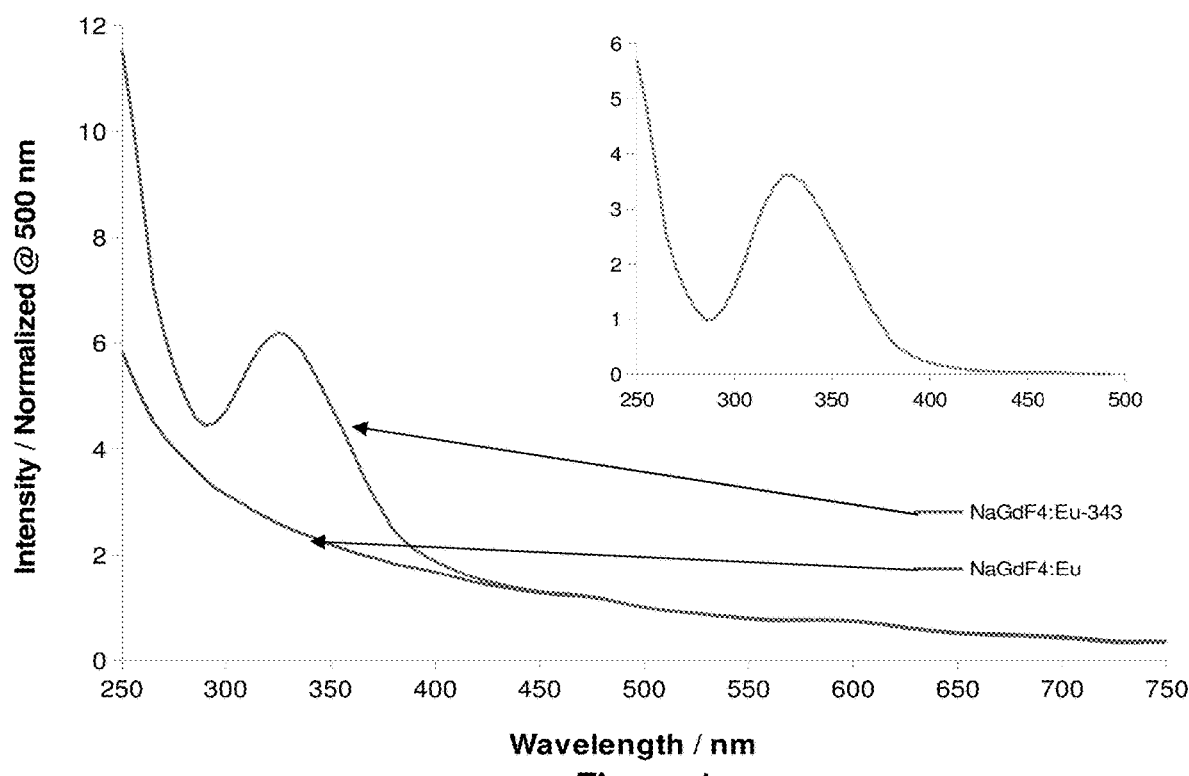
FIG. 1 illustrates an absorption spectrum of $NaGd_{0.95}Eu_{0.05}F_4$ nanoparticles with and without 3,4,3-LI(1,2-HOPO) surface modification. Inset: difference spectrum between modified and unmodified nanoparticles.

Dismal quantum yields of many up/down-conversion systems have hampered their practical implementation. In the case of lanthanide-based spectral converters, low external quantum yields can largely be assigned to the low absorption cross sections of their f-f transitions (~10 $M^{-1}$ $cm^{-1}$). Embodiments provided herein relate generally to lanthanide nanocrystals as ultraviolet downconverters.

Low external quantum yields remain a major hindrance to the practical utility of many lanthanide nanoparticle upconverting and downconverting systems, a partial result of the low absorption cross-sections common to the Laporte-forbidden f-f transitions in lanthanides. While some research has demonstrated these low absorptivities may be overcome via d-f charge separation in divalent lanthanides, little work has explored the possibility of using organic ligands with high absorption coefficients to photosensitize excited states in lanthanide nanocrystals. The present disclosure details the synthesis and photophysical characterization of $NaGd_{1-x}Eu_xF_4$ nanoparticles (or other lanthanide containing nanoparticle) displaying a HOPO ligand, such as 3,4,3-LI(1,2-HOPO), on their surfaces, which functions as the terminal light absorber in this system. The resulting $NaGd_{1-x}Eu_xF_4$-HOPO ligand (e.g., any lanthanide containing nanocrystal with, e.g., 3,4,3-LI(1,2-HOPO)) construct is shown to be an effective downconverter of UV (250-360 nm) light into Eu(III) luminescence, indicating that such ligand sensitization can overcome the constraints of UV solar spectrum/semiconductor band-gap mismatch and low absorption cross-sections in solid-state lanthanide systems.

The problem of spectral mismatch between semiconductor band gaps and Earth's terrestrial solar spectrum remains an issue plaguing the efficiency of modern photovoltaics[1,2]. A number of methods have been proposed and implemented to circumvent this problem, including the incorporation of materials absorbing at different wavelengths in multi-junction photovoltaics, modification of the intrinsic Si band gap through advanced nanofabrication methods, and the respective up- and down-conversion of low- and high-frequency EM radiation into photons suited for bulk Si absorption.

Despite a sizable body of scholarship currently focused on light upconversion[3-6], comparatively little work has addressed the challenge of ultraviolet (UV) downconversion towards the low-energy visible and near-infrared (NIR) regimes, where the photocurrent response for bulk silicon is highest. Currently, research in this field is dominated by lanthanide photophysics, where exploitation of f-element nanocrystals has resulted in a wide array of potential downconverters[7-12]. However, the maturation of these prototype systems into practical applications has largely been hampered by the low molar absorptivities of f-f transitions (~10 $M^{-1}$ $cm^{-1}$)[13,14]. Routes previously explored to address this challenge include the relaxation of Laporte selection rules through the embedding of lanthanide ions in low-symmetry crystal hosts and the employ of parity-allowed, d→f charge transfer in divalent lanthanides such as Eu(II)[15]. By contrast, the possibility of photosensitizing nanocrystalline downconverters with organic ligands remains a novel method of enhancing f-block nanoparticle light absorption, though a recent study has implemented such schemes in light upconversion[16], and some work exploring the chemical effects surface ligands may have on nanoparticle luminescence has been conducted[17,18].

Provided below are various embodiments employing various lanthanides combined with a HOPO ligand (also referenced as a HOPO chelator).

In some embodiments, a light conversion material is provided that comprises a lanthanide nanocrystal and a HOPO containing chelator. Any lanthanide and HOPO chelator combination can be employed, as long as it allows the light absorbed by the HOPO chelator to be transferred to the lanthanide for effective use via the lanthanide. In some embodiments, the use is in conjunction with a photovoltaic cell.

In some embodiments, a photovoltaic cell is provided that comprises a lanthanide nanocrystal and a HOPO containing chelator. While various embodiments provided herein are described in terms of an application to a photovoltaic cell, the present compositions and nanocrystals are not limited to this application. Indeed, these compositions and nanocrystals can be applied in any situation where such light conversion is relevant.

In some embodiments, any of the photovoltaic cells (or, more generally, light conversion materials) described herein can convert UV radiation to low-energy visible or near-infrared wavelengths. In some embodiments, any of the photovoltaic cells (or, more generally, light conversion materials) described herein can convert UV radiation to any wavelength of light on the visible light spectrum, depending on the lanthanide dopant used in the crystal. In the particular case of the Eu doped nanoparticles, UV light is converted to light between 580 and 720 nm. In the case of the Nd/Yb co-doped, core-shell nanoparticles, UV light is converted to infrared (IR) light between 850 and 1100 nm. The wavelengths produced by the Nd/Yb are the most relevant for photovoltaic cell applications. In some embodiments, the HOPO containing chelators described herein is defined by 1,2-HOPO structure:

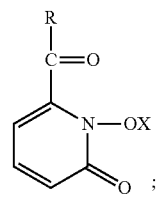

wherein R is a hydroxy group or

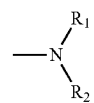

where $R_1$ and $R_2$ are selected from the group consisting of H, —$CH_3$, —$CH_2CH_3$ and —$CH_2$—φ, and X is either hydrogen, an alkali metal ion, or a quaternary ammonium ion.

In some embodiments, any of the HOPO containing chelators described herein is defined by one molecule selected from the group consisting of:

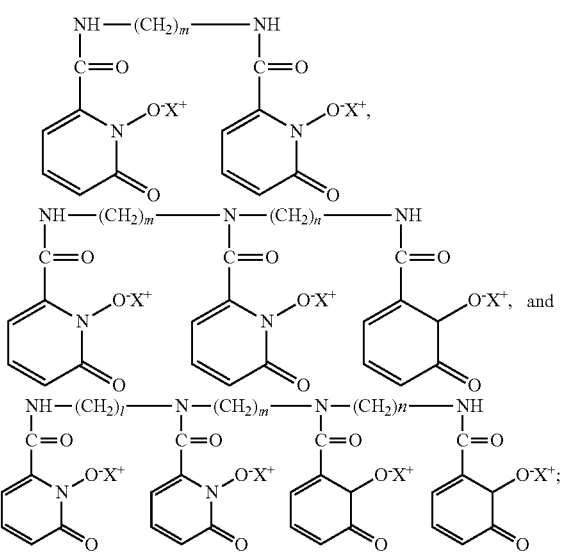

wherein l, m, and n are integers between one and twenty. In some embodiments, m is three and/or four. In some embodiments, l and n are three, and m is four. In some embodiments, the HOPO containing chelator is 3,4,3-LI-(1,2-HOPO).

In some embodiments, the photovoltaic cell (or, more generally, light conversion materials) described herein comprise a 3,4,3-LI-(1,2-HOPO) containing chelator that is attached to the surface of the nanocrystal.

Any of the lanthanides described herein may comprise any of the lanthanides in the lanthanide series, for example, Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), and Lutetium (Lu). In some embodiments, the oxidation state of any of the lanthanides described herein is two, for example, Nd(II), Pm(II), Eu(II), Gd(II), Tb(II), Dy(II), Ho(II), Er(II), Tm(II), Yb(II), or Lu(II).

In some embodiments, the oxidation state of any of the lanthanides described herein is three, for example, Nd(III), Pm(III), Eu(III), Gd(III), Tb(III), Dy(III), Ho(III), Er(III), Tm(III), Yb(III), or Lu(III).

In some embodiments, the lanthanide is a luminescent lanthanide. In some embodiments, the luminescent lanthanide has an oxidation state of three. In some embodiments, the luminescent lanthanide is Sm(III), Eu(III), Tb(III), or Dy(III).

In some embodiments, a lanthanide nanocrystal (which can be, for example, within or covering a part of a photovoltaic cell) is provided that comprises $NaGd_{1-x}Eu_xF_4$ wherein x is between 0 and 1, for example, 0.005, 0.01, 0.015, 0.02, 0.025, 0.03, 0.035, 0.04, 0.045, 0.05, 0.055, 0.06, 0.065, 0.07, 0.075, 0.08, 0.085, 0.09, 0.095, or 0.1 or any value in between these percentages. In some embodiments, x is between 0.005 and 0.1. In some embodiments, a nanocrystal is provided that comprises $NaGd_{0.95}Eu_{0.05}F_4$. As will be appreciated by one of skill in the art, Eu may be replaced by any of the other lanthanides provided herein. The nanocrystal can be part of a photovoltaic cell.

In some embodiments, the photovoltaic cell (or, more generally, light conversion materials) comprises a lanthanide nanocrystal that comprises $NaGd_{1-x}Eu_xF_4$ and a 3,4,3-LI(1,2-HOPO) ligand wherein the ligand is attached to the surface of the nanocrystal. As will be appreciated by one of skill in the art, Eu may be replaced by any of the other lanthanides provided herein.

In some embodiments, a nanocrystal is provided that comprises a $NaGd_{1-x}Eu_xF_4$ nanocrystal and a 3,4,3-LI(1,2-HOPO) ligand. In some embodiments, the 3,4,3-LI(1,2-HOPO) ligand coats a surface of the nanocrystal. In some embodiments, the ligand coats 100% of the surface of the nanocrystal. In some embodiments, the ligand coats less than 100% of the surface, for example, 90%, 80%, 70%, 60%, 50%, 40%, 30%, 20%, 10%, 1%, or any value between these percentages. In some embodiments, the nanocrystal comprises $NaGd_{1-x}Eu_xF_4$, where x is the doping level, a value between 0 and 1. In some embodiments, $NaGd_{0.95}Eu_{0.05}F_4$ (x=0.05). As will be appreciated by one of skill in the art, Eu may be replaced by any of the other lanthanides provided herein In some embodiments, any of the nanocrystals described herein have one dimension that is smaller than 1000 nanometers. In some embodiments, any of the nanocrystals described herein have more than one dimension that is smaller than 1000 nanometers. The one or more dimension can be 1 millimeter, 100 micrometers, 10 micrometers, 1 micrometer, 100 nanometers, 10 nanometers, or smaller. In some embodiments, the nanocrystals described herein are arranged in a single-crystalline arrangement. In some embodiments, the nanocrystals described herein are arranged in a poly-crystalline arrangement.

Any of the nanocrystals described herein can take on a variety of shapes including but not limited to a cube, an octahedron, or a rhombic dodecahedron.

In some embodiments, a nanoparticle is provided that comprises (i) a core. The core comprises a first lanthanide and Yb. The nanoparticle comprises (ii) a shell coating the core. The shell comprises the first lanthanide. Attached to the surface of the shell is a HOPO ligand, such as 3,4,3-LI(1,2-HOPO). In some embodiments, the first lanthanide and the second lanthanide are the same lanthanide.

In some embodiments, the first lanthanide that is part of the nanoparticle is one or more of $Pr^{3+}$, $Nd^{3+}$, or $Tb^{3+}$. In some embodiments, the second lanthanide that is part of the nanoparticle is one or more of $Pr^{3+}$, $Nd^{3+}$, or $Tb^{3+}$.

In some embodiments, the first lanthanide and second lanthanide are different lanthanides.

In some embodiments, there are two different lanthanides. One type of lanthanide can be contained in an outer shell, another can be contained within a core, that is surrounded by the shell. In some embodiments, the first type of lanthanide can be present in both the outer shell and the core, while the other type of lanthanide is only present in the core. These shell/core arrangements are discussed in more detail below.

In some embodiments, the nanoparticles described herein can generate multiple infrared photons for each single photon absorbed. In some embodiments, a nanoparticle can generate two infrared photons for a single photon absorbed by the HOPO chelator (e.g., 3,4,3-LI(1,2-HOPO)). Thus, in some embodiments, the nanoparticle and ligand coating are configured so as to generate two infrared photons for a single photon absorbed by the HOPO chelator (e.g., 3,4,3-LI(1,2-HOPO)).

In some embodiments, the nanoparticle is between 1 and 100 nanometers, for example, 10 nanometers, 20 nanometers, 30 nanometers, 40 nanometers, 50, nanometers, 60 nanometers, 70 nanometers, 80 nanometers, or 90 nanometers. In some embodiments, the size range is from 5-200 nanometers. In some embodiments, the size of the crystal is not limited.

In some embodiments, the method of downconverting light from UV to visible comprises (i) illuminating a 3,4,3-LI(1,2-HOPO) ligand with UV radiation such that the ligand absorbs energy in the UV spectrum and (ii) transferring energy to $NaGd_{1-x}Eu_xF_4$. As will be appreciated by one of skill in the art, Eu may be replaced by any of the other lanthanides provided herein. In some embodiments, the ligand coats the surface of the nanocrystal and the lanthanides are embedded (doped) inside the crystal.

In some embodiments the energy absorbed in the UV spectrum has a wavelength of between 270 nm and 390 nm, for example, 271 nm, 280 nm, 290 nm, 300 nm, 310 nm, 320 nm, 330 nm, 340 nm, 350 nm, 360 nm, 370 nm, 380 nm, 389 nm, or any value in between any two of these wavelengths.

In some embodiments, use of the 3,4,3-LI(1,2-HOPO) ligand (or any other HOPO ligand) in downconverting light results in at least a two order of magnitude increase in the light absorption compared to using $NaGd_{1-x}Eu_xF_4$ (or other lanthanide containing nanocrystal) without the ligand. In some embodiments, use of the HOPO (e.g., 3,4,3-LI(1,2-HOPO)) ligand in downconverting light results in at least a three order of the magnitude increase in the light absorption when compared to using $NaGd_{1-x}Eu_xF_4$ (or other lanthanide containing nanocrystal) without the ligand, for example, a four order of magnitude increase, a five order of magnitude increase, a six order of magnitude increase, or a seven order of magnitude increase. In some embodiments, any chelator that absorbs at a desired wavelength can be used.

In some embodiments, a method of producing a two-photon emission can comprise (i) providing any of the nanoparticles described herein (e.g., a lanthanide containing nanocrystal with a HOPO ligand), (ii) irradiating the HOPO ligand (e.g., 3,4,3-LI(1,2-HOPO)), (iii) transferring energy from the HOPO ligand (e.g., 3,4,3-LI(1,2-HOPO)) to the second lanthanide, which is in the shell, (iv) transferring energy from the second lanthanide to the first lanthanide, which is in the core and (v) transferring energy from the first lanthanide to Yb, which is also in the core. The first lanthanide and the second lanthanide are the same type of elemental lanthanide. The process can further include (vi) emitting two photons from Yb for each photon that excited the HOPO ligand (e.g., 3,4,3-LI(1,2-HOPO)).

In some embodiments, the HOPO used in the method is 1,2(HOPO). In some embodiments, any HOPO ligand with the desired absorption and emission characteristics can be used, including 3,4,3-LI(1,2-HOPO).

In some embodiments any of the methods comprise a step of cooling the nanoparticle. In some embodiments, the nanoparticle is at room temperature. In some embodiments, the nanoparticle has a temperature between 77-350K, for example 78K, 120K, 160K, 200K, 240K, 280K, 320K, 349K, or any temperature between these temperatures.

In some embodiments, a two-photon system is provided. Two-photon downconverting systems have been demonstrated in multiply-doped lanthanide systems. However, these constructs have been dependent on direct excitation of the metals involved, which suffers from the problem of poor excitation efficiency due to the low light absorption coefficients of lanthanides. Decoration of such inorganic particles with organic ligands serving as light sensitizers serves to overcome this problem, with concomitant increases in external quantum yield. In some embodiments, a scheme is employed where a Ln3+/Yb3+ couple (Ln=Pr, Tb or Nd) is used in a core-shell nanoparticle architecture. Specifically, an NaGdF4 core structure co-doped with Ln3+ and Yb3+ is surrounded by an NaGdF4 shell singly-doped with Ln3+. Following synthesis of the core-shell structure, a ligand sensitizer (e.g., a HOPO ligand, such as 3,4,3LI(1,2-HOPO)) is bound to the nanoparticle shell. Using such systems, one can increase the overall solar conversion efficiency of solar cells by increasing their range of usable sunlight. Currently, downconversion materials do not enjoy mainstream implementation in commercial photovoltaics.

In some embodiments, one can synthesize a core-shell nanomaterials capable of efficiently absorbing light through surface-bound, ligand sensitizers. One can then use this core-shell material to funnel the energy into metal excited states, which ultimately result in the production of infrared (IR) photons. This allows for light at infrared wavelengths to be efficiently absorbed by conventional silicon solar cells.

In some embodiments, this effectively expands the range of usable sunlight available to photovoltaics for solar energy conversion, while also allowing for the possibility of two-photon downconversion, i.e., the generation of two infrared photons for every photon absorbed by the ligand.

In some embodiments, the composition is comprised of a doubly-doped $NaGdF_4$ host nanoparticle core (lanthanide, Ln, and Yb3+ dopants; Ln=Pr3+, Nd3+ or Tb3+), surrounded by a singly-doped nanoparticle shell (Ln only); the ligand absorber (e.g., 3,4,3-LI(1,2-HOPO)) is bound to the nanoparticle shell using solution synthesis methods.

In some embodiments, the general operation is as follows: light is absorbed by the ligands decorating the particle shells; subsequent energy transfer between the ligand and the Ln dopant in the shell result in generation of Ln excited states. Energy exchange occurs between equivalent Ln dopants in the shell and core, leading to the eventual production of Ln excited states in the nanoparticle core. Energy transfer from Ln to Yb3+ in the core results in production of Yb3+ excited states. Decay of the ytterbium excited states results in infrared emission between ca. 950 and 1030 nm. Concomitant decay of $Nd^{3+}$ excited states also results in emission at 850-870 nm and at 1060 nm.

While, taken separately, there are standing precedents for both ligand sensitization of metals and the employ of core-shell nanoparticles for various studies, the successful demonstration of multiphoton light downconversion in nanoparticles driven by of ligand sensitization has yet to be reported. Preliminary data (in example 1 below) indicated that the current system (a $Nd^{3+}/Yb^{3+}$ core-shell) displays ligand-sensitized, two-photon emission when cooled to 77 K, evidenced from studies on the power dependence of nanoparticle IR luminescence. Successful demonstration of this concept involved the use of nanoparticle architectures that prohibit the direct sensitization of Yb3+ by the ligand, a low-quantum yield process that would interfere with multiphoton production. For this reason, a core-shell structure with the described doping scheme was adopted, allowing for the desired process Ligand→Nd (shell)→Nd(core)→Yb(core). These design aspects make this arrangement a counter-intuitive departure from the ligand-sensitized nanoparticle structures that have been described to date. In some embodiments, the structure of the composition is such that there is a lanthanide present in both the core and the shell, a ligand coating and/or forming the shell with the lanthanide, and an additional lanthanide (such as Yb) that is contained only within the core.

In some embodiments, the present compositions and methods can be used in any industry related to the development of new light-harvesting technologies. In some embodiments, the compositions or nanocrystals can be part of a photovoltaic cell. In some embodiments, the compositions or nanocrystals can be added to a surface of a photovoltaic cell, after the cell has been manufactured and/or installed.

In some embodiments, any of the compositions or nanocrystals provided herein can be part of a photochemical and/or photovoltaic cell. In some embodiments, a photovoltaic cell can include an "optically active" region in which electricity is generated and two contacts for extracting that electricity. The optically active region typically comprises abutting layers of n-type semiconductor and a p-type semiconductor. In some embodiments, a single p-n junction is created at the interface of the layers, thereby creating an electric field. In some embodiments, any of the compositions or nanocrystals provided herein are optically coupled to a photovoltaic cell. In some embodiments, one can use the photovoltaic cell that is optically coupled to any of the compositions or nanocrystals provided herein to generate electricity. In some embodiments, any of the compositions or nanocrystals provided herein can be positioned or located within a glass layer, transparent surface or substrate or other lightguide material and/or structure so that light can contact any of the compositions or nanocrystals provided herein and allow the compositions or nanocrystals provided herein to produce the relevant energy and/or light for the standard photovoltaic cell. In some embodiments, any of the compositions or nanocrystals provided herein can be applied to a standard photovoltaic cell as a coating or film, over the light absorbing section of the photovoltaic cell. In some embodiments, a multi-layer film can be used. In some embodiments, any of the compositions or nanocrystals provided herein can be part of an optoelectronic device, which can be a photodiode, a light emitting diode, a photovoltaic device, or a semiconductor laser. These optoelectronic devices can be used in variety of applications. Examples of applications include an electronic display, a photo detector, general lighting, a camera, and fiber-optic communication. In some embodiments, the optoelectronic device is a photovoltaic cell or a photovoltaic module. The photovoltaic module may have an array of the photovoltaic cells. The photovoltaic module may have a glass cover protecting the cells onto which the functional coating is disposed. The functional coating can be disposed on the photovoltaic cells, or on the photovoltaic module, such that the functional coating is exposed to the solar radiation. In some embodiments, the functional coating is disposed on the backside of a module glass cover. The coating can be deposited on more than one location of the photovoltaic module. For example, the coating can be deposited on a topside of a module glass cover, a backside of a module glass cover, and/or on a surface of the solar cells in the module, such that the coating is exposed to the solar radiation. In some embodiments, the photovoltaic module or the photovoltaic cell may include, but is not limited to, an amorphous silicon cell, a crystalline silicon cell, a hybrid/heterojunction amorphous and crystalline silicon cell, a CdTe thin film cell, a micromorph tandem silicon thin film cell, a Cu(In,Ga)Se$_2$ (CIGS) thin film cell, a GaAs cell, a multiple-junction III—V-based solar cell, a dye-sensitized solar cell, or a solid-state organic/polymer solar cell. In some embodiments, the solar cell can contain a transparent conductor onto which the coating is deposited.

The various embodiments described below provide for the construction of a UV downconverter featuring the ligand 3,4,3-LI(1,2-HOPO) (abbreviated '343') as an ultraviolet photosensitizer of NaGd$_{1-x}$Eu$_x$F$_4$ nanoparticles. These can be used for different HOPO ligands, as well as for different lanthanides.

EXAMPLES

Example 1

It has been previously shown that population of Eu(III) excited states in the Eu(III)-343 molecular complex occur via energy transfer from the 343 triplet state following UV absorption by the ligand[19-22]. Surface display of this lanthanide chelator on nanoparticle surfaces is achieved through substitution of 1-oleate ligands retained on the nanoparticles following their initial synthesis. The resultant nanocrystals show good performance as UV-Vis downconverters, with red luminescence resulting from UV exposure serving as a diagnostic of Eu(III) sensitization by 343. Here, funneling light into europium $^5D_j$ manifolds via energy transfer from aromatic ligand absorbers benefits from the high molar absorptivity of 343 (~17,000 M$^{-1}$ cm$^{-1}$) relative to f-f transitions. The net effect was an expansion of nanocrystal light absorption by over three orders of magnitude relative to typical lanthanide nanocrystals systems, where metal-centered excitation is generally employed. As a consequence of 343's broad absorption profile, this scheme also significantly increased the spectral bandwidth available for downconversion, which marked a notable improvement over the narrow absorption lines typical of lanthanides.

Absorption data was acquired following the displacement of 1-oleate with the ligand 3,4,3-LI(1,2-HOPO) revealed spectra representing the superposition of a broad ultraviolet transition ($\lambda_{max}$=317 nm) and Rayleigh scattering. The spectral shape and transition energy of the UV absorption were characteristic of the 343 ligand and were not observed in the absorption spectra of the unmodified particles (FIG. 1). Additionally, the normalized difference spectrum between the ligand-modified and unmodified particles looked virtually identical to that of the free ligand. Taken together, these data indicated that the 343 chelator effectively binds lanthanide ions at the surface of NaGdF$_4$ nanoparticles.

Figure 2A:
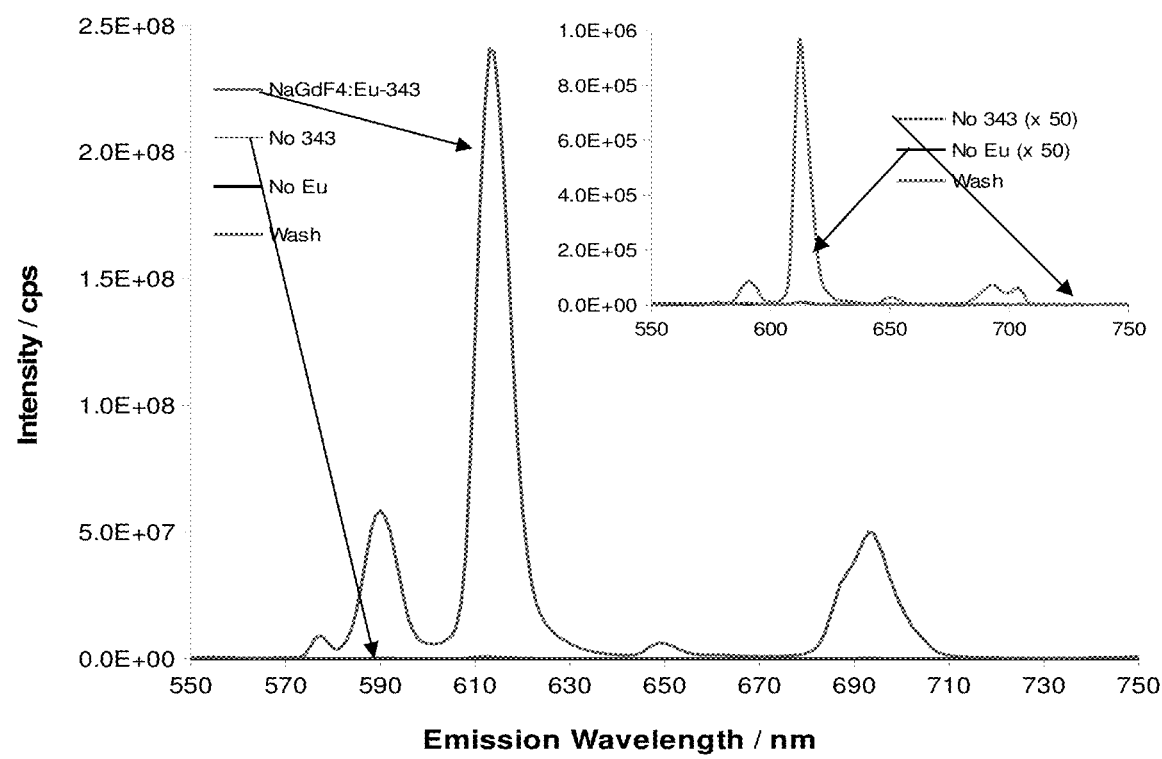
FIG. 2a illustrates nanoparticle luminescence spectra. Inset: magnified view of wash, Eu-free and ligand-free control spectra in ethanol.
Figure 2B:
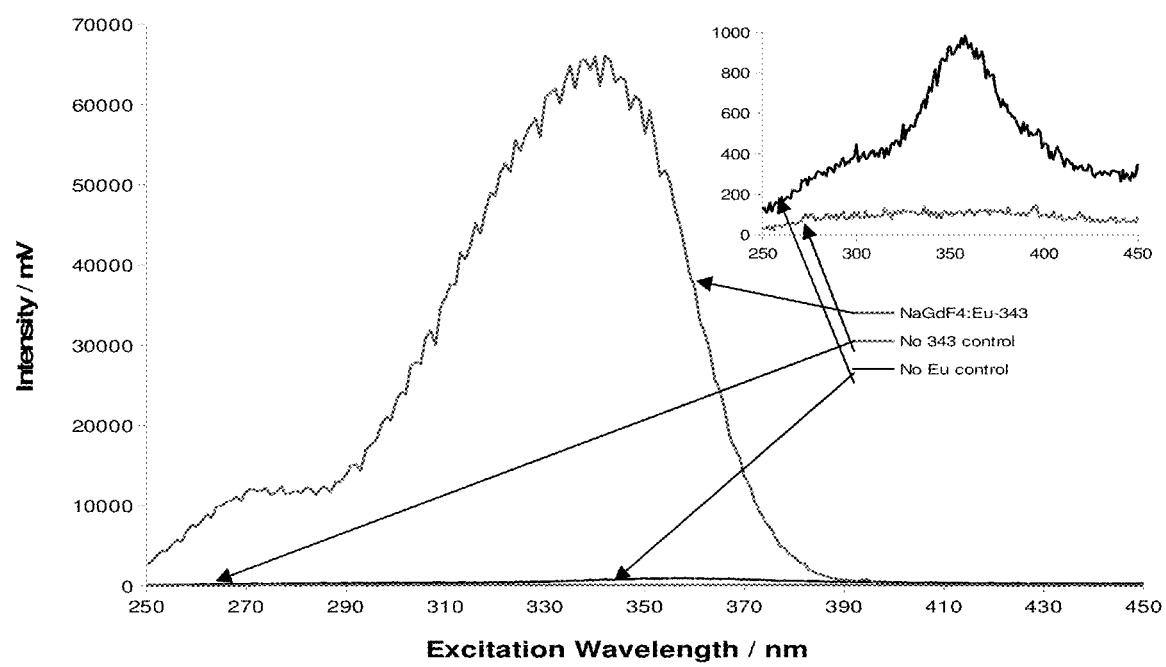
FIG. 2b illustrates nanoparticle excitation (action) spectra in ethanol measured at 612 nm. The minor peak seen in the no-Eu control (magnified scale) is a result of broad luminescence from the broad 343 emission, which has residual overlap with the Eu luminescence region.
Figure 4:
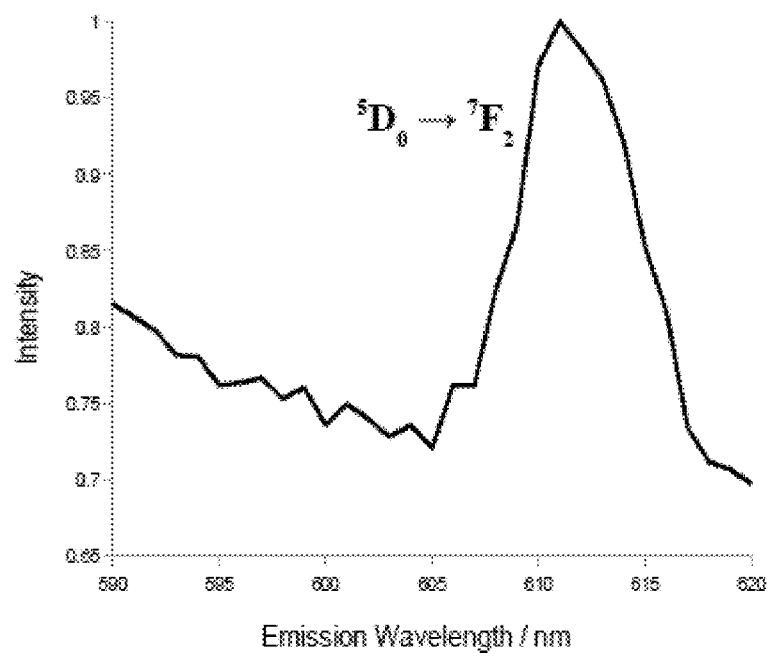
FIG. 4 demonstrates the direct excitation of Eu(III) in NaGd0.95Eu0.05F4 Nanocrystals. Top Panel: Luminescence spectra of ligand-free particles under 520 nm excitation. Bottom Panel: Excitation spectrum at 612 nm of ligand-free particles. As a result of the low absorption intensities of f-f transitions, both spectra were acquired using 2 nm excitation slits, 3 nm emission slits and a 10.0 s integration time.
Figure 4:
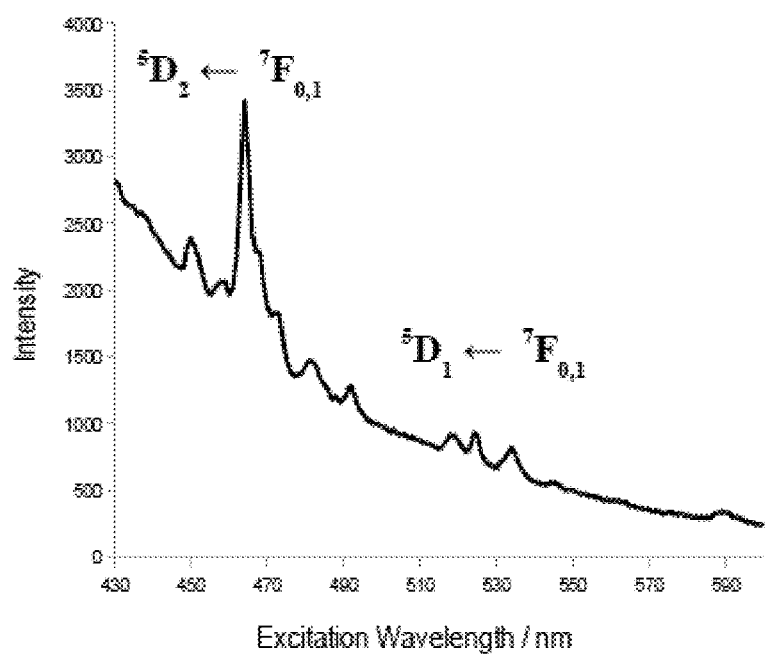

Emission spectra of 343-modified nanocrystals suspended in ethanol revealed a strong dependence of the Eu(III) luminescence on excitation in the ultraviolet region that was absent in the unmodified nanocrystals (FIG. 2a). Specifically, the $^5D_0 \to ^7F_2$ Eu transition exhibited an excitation dependence reflective of the 343 absorption spectrum, with metal-centered emission observed at excitation wavelengths ranging from 300-360 nm and peaking around 340 nm (FIG. 2b). This correspondence between the nanoparticle action spectrum and the 343 absorption spectrum, along with concomitant Eu emission upon UV irradiation, demonstrated that energy transfer between ligand and metal states is operative. This observation is consistent with previous reports describing Eu(III) sensitization by 343 phosphorescence in the Eu-343 molecular complex.[20] The absence of europium luminescence in no-343 and undoped NaGdF$_4$-3, 4,3 controls upon UV excitation corroborated the interpretation that the red emission from these particles is dependent on ligand-to-metal energy transfer between 343 surface chelators and the Eu(III) lattice dopants. Direct f-f excitation of these samples between 250 and 500 nm produce only weak luminescence from Eu ions (FIG. 4).

Overall downconversion efficiencies were also evaluated through determination of nanoparticle quantum yields using the integrated sphere method. Variability in syntheses between independent nanoparticle batches resulted in a quantum yield of 3.3±0.6%. This quantum yield was considerably lower than the value of Φ=0.15 reported for Eu-343 molecular complexes.[22] In attempts to address this discrepancy quantitatively, the findings were used to provide an estimate of the ligand to metal energy transfer rate and efficiency. The approach was rooted in first calculating the average energy transfer efficiency ($\langle\eta\rangle$) through equation (1)[23]:

$$\langle\eta\rangle = 1 - \sum_j \frac{T_{DAj}}{T_{Dj}} c_j, \qquad (1)$$

To account for the multiple donor states arising from splitting of the 343 triplet, modifications of the typical rate and energy efficiency equations were used for Förster transfer. Here, an averaged energy transfer rate was comprised of a weighted summation of emissive state lifetimes according to their respective spectral contributions, where $\tau_{Dj}$ and TDAJ are the respective lifetimes of the jth 343 triplet donor (D) levels in the absence and presence of the europium acceptor (A). The normalized coefficient, $c_j$, is used to represent the spectral contribution of individual states j to the overall transient decay. An average rate of energy transfer between ligand and metal states was then found according to equation (2):

$$\langle k_T \rangle = \frac{\langle \eta \rangle \langle k_D \rangle}{1 - \langle \eta \rangle}. \quad (2)$$

Here, $\langle k_T \rangle$ was the averaged energy transfer rate and $\langle k_D \rangle$, the average decay rate of the 343 triplet in the absence of acceptor ion, was defined as:

$$\langle k_D \rangle = \sum_j k_{Dj} c_j, \quad (3)$$

with $k_{Dj}$ expressing the decay rate of the jth component of the 343 triplet.

Figure 3:
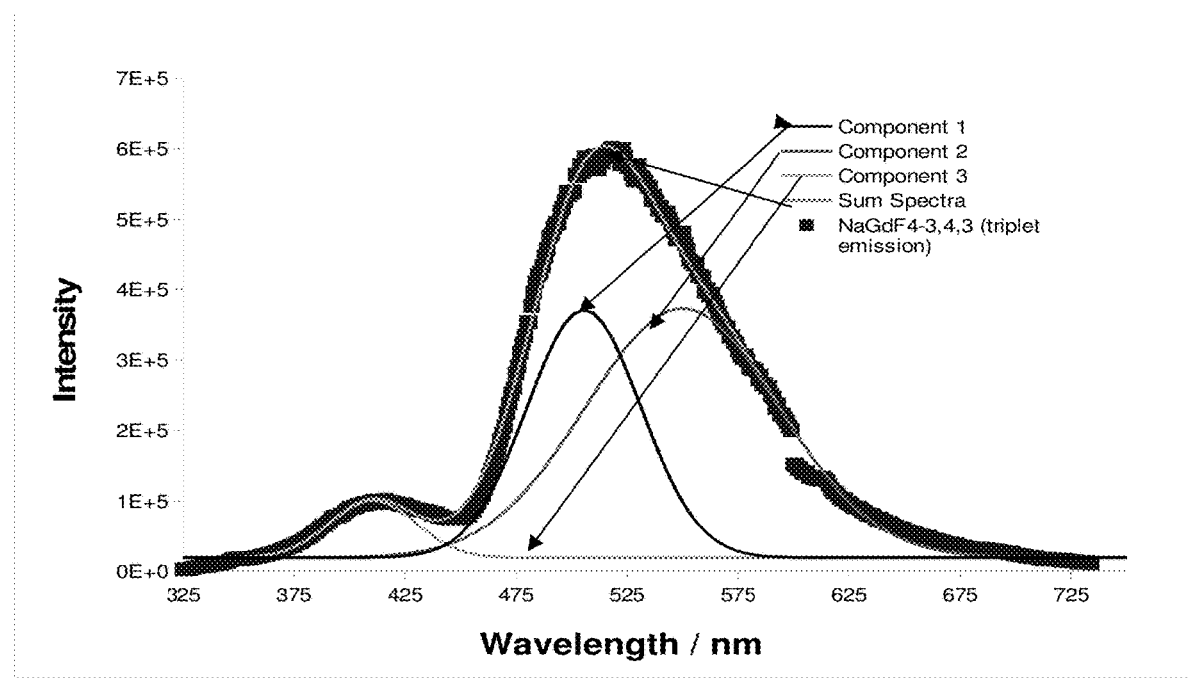
FIG. 3 illustrates a triplet spectrum of 3,4,3-LI(1,2-HOPO) (bound to no-Eu control nanoparticles) in ethanol at 77 K (red squares). The peak emission around 525 nm is a composition of states (components 1 & 2) which comprise the 343 triplet manifold. The Gaussian character of these deconvoluted states suggests a significant degree of heterogenous broadening in the ligand luminescence. Overlap of multiple components at 525 nm provides a physical basis for the observed multi-exponential character of time-resolved probes at this wavelength.
Figure 5:
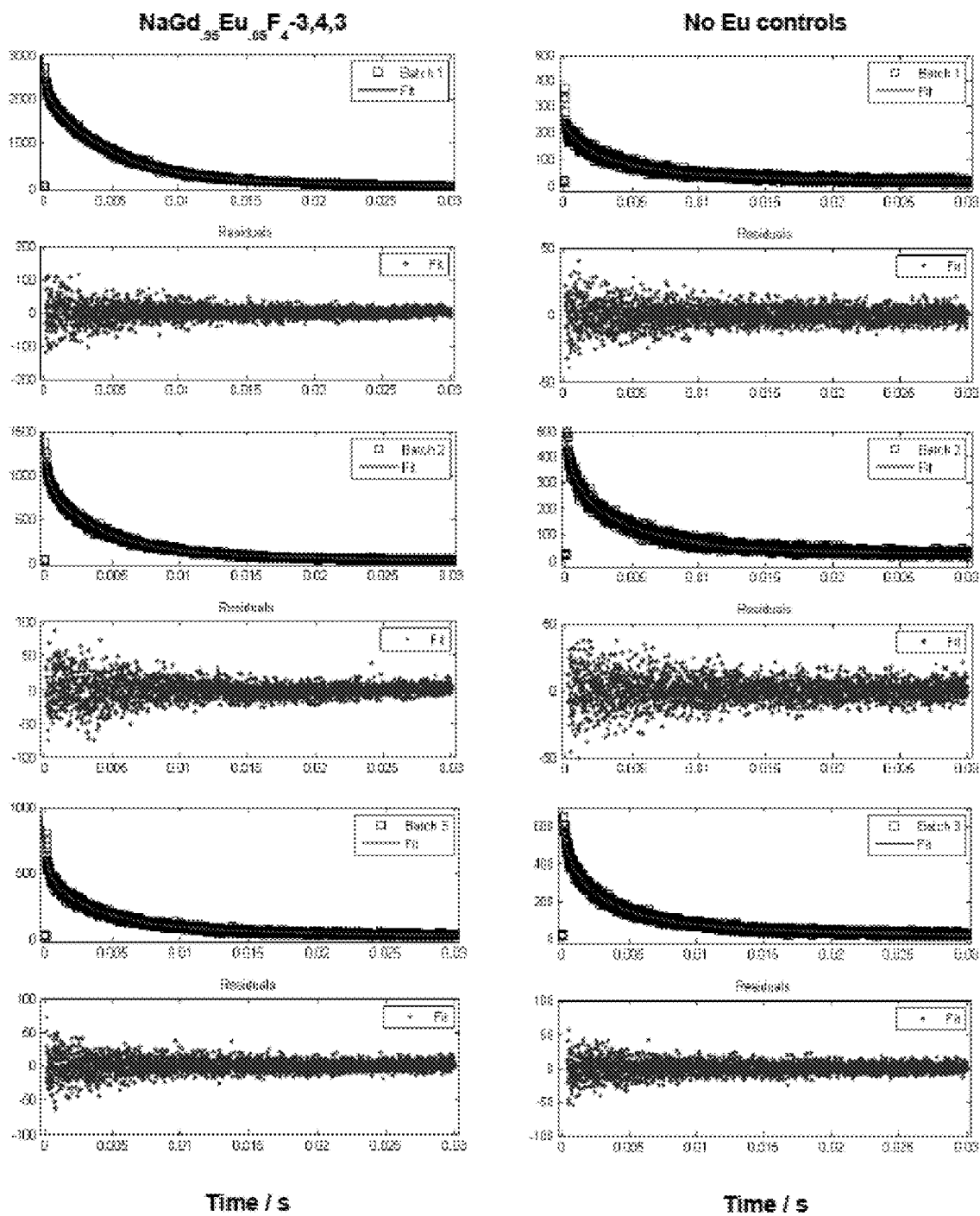
FIG. 5 is a graph demonstrating time-resolved emission of 3,4,3-LI(1,2-HOPO) phosphorescence at 525 nm in Ethanol Glass at 77 K.

Donor luminescence lifetimes in the presence and absence of europium acceptor quenching were quantified through time-resolved measurement of 343 phosphorescence from NaGdF$_4$-343 nanoparticles under 317 nm excitation at 77 K. Steady-state measurement of the 343 triplet state at 77 K revealed a broad emission centered around 525 nm (FIG. 3). Monitoring the ligand triplet's decay at this peak region yielded a decay process composed of three distinct processes (FIG. 5). Averaging data over three trials revealed that two of these three phases displayed significant quenching upon europium substitution, suggesting that these are states implicated in energy transfer between the ligand and metal.

This conclusion was also supported by Gaussian deconvolution of the 343 triplet steady-state luminescence, which revealed two overlapping electronic contributions to the 525 nm emission signal used for time-dependent probes (FIG. 3). Both components displayed decay constants in a range characteristic of triplet state deactivation and spectral overlap with the hypersensitive $Eu^{3+}$ $^7F_{0,1} \rightarrow {}^5D_2$ absorption at 465 nm (FIG. 4, 5). In the undoped case, $k_1$=1513±301 s$^{-1}$, and $k_3$=29.7±3.9 s$^{-1}$, while for europium-incorporated particles, $k_1$=2652±216 s$^{-1}$ and $k_3$=47.5±9.1 s$^{-1}$. Europium substitution, at the low concentration used for this study, did not significantly perturb the relative contributions of the fast and slow phases to the transient decay. At this wavelength, it was found that f=0.3 and 0.1 for the fast and slow components, respectively (FIG. 5, Table 1). A third phase contributing to the time-resolved spectra was largely unchanged by the 5% europium substitution, displaying decay rates that were statistically equivalent between the samples and Eu-free controls ($k_2$=238.6±8.8 s$^{-1}$ and 240.8±20.5 s$^{-1}$, respectively; f=0.6). Such behavior suggested that this component was not responsible for energy transfer observed between ligand and metal states in this system.

TABLE 1

Time-Resolved Emission of 3,4,3-LI(1,2-HOPO) at 525 nm in Ethanol Glass at 77K.

| Rates & Intensities | Donor Only Batch 1 | NaGdF4-3,4,3 Batch 2 | Batch 3 |
|---|---|---|---|
| k1 | 1687 | 1687 | 1166 |
| k2 | 230.4 | 247.9 | 237.6 |
| k3 | 26.18 | 25.23 | 32.69 |
| c1 | 65.88 | 170.5 | 203.9 |
| c2 | 145.2 | 257 | 299.9 |
| c3 | 38.75 | 60.85 | 68.26 |
| Normalized Intensities | Batch 1 | Batch 2 | Batch 3 |

Comparison of the calculated energy transfer rate with measured 343 excited state lifetimes provides insight into the origins of the low downconversion quantum yields observed with this system. Workup of the relevant spectral data yielded a mean energy transfer rate of 124 s$^{-1}$ and an energy transfer efficiency of 0.17 between the 343 triplet excited state and the europium $^5D_j$ manifold. This energy transfer rate is considerably lower than the weighted decay time measured for the 343 donor (600 s$^{-1}$), indicating that ligand triplet-to-ground state deactivation is favored over Förster transfer in this system. It should be emphasized that this value of the transfer efficiency is likely an upper bound in the system, as these values were derived from 77 K measurements, a temperature where triplet decay through non-radiative decay paths would be reduced relative to luminescence quenching at room temperature. Regardless, these findings indicate that poor coupling between the 343 triplet and europium-centered states largely accounts for the energetic losses, and correspondingly low quantum yields, observed during optical downconversion in these nanocrystals.

This work indicates that ligand-sensitized nanoparticle downconversion can serve as one route through which the constraints of solar spectrum/semiconductor band gap mismatch, and the low absorption cross-sections of lanthanides, may be overcome for solid-state systems.

While the characterizations presented in this example are largely fundamental in nature, incorporation of this technology into any commercial solar capture device can also include practical matching regarding luminescence optimization of these nanoparticle chelates, particularly through their dependence on Eu content and ligand:nanoparticle ratios. Furthermore, having demonstrated the viability of this approach opens up sensitizing rare-earth fluorides suited for transforming UV light into NIR emission, where Si photocurrent response is greatest. While the much-studied $Pr^{3+}/Yb^{3+}$ and $Tb^{3+}/Yb^{3+}$ couples provide intuitive starting points for this effort[2,24-26], previous work has indicated that utilizing $Pr^{3+}/Yb^{3+}$ co-substitution will require a ligand better-suited for $Pr^{3+}$ sensitization, as 343 displays poor coupling with the praseodymium $^3P_j$ levels required for two-photon downconversion via $Yb^{3+}$ ($^2F_{5/2} \rightarrow {}^2F_{7/2}$) luminescence [21].

Experimental Details for Example 1

Nanoparticle Synthesis

Nanoparticles were synthesized according to the methods of Wang et al. Preparation of Core-Shell NaGdF4 Nanoparticles Doped with Luminescent Lanthanide Ions to Be Used as Upconversion-Based Probes. *Nat. Protoc.* 2014, 9 (7), 1634-1644.). Reaction compositions were 3.8 ml Gd(CH$_3$CO$_2$)$_3$.xH$_2$O (Sigma-Aldrich), 200 µl Eu(CH$_3$CO$_2$)$_3$.xH$_2$O (Sigma-Aldrich) in a solvent composition of 8 ml 1-oleic acid (Alfa Aesar) and 12 ml 1-octadecene (90%, Sigma-Aldrich).

Ligand Surface Functionalization

Aliquots (2 ml) of nanoparticles in cyclohexane were precipitated by addition of 2 ml of ethanol. Particles were pelleted via centrifugation at 13000 rpm for 5 minutes. The solvent was decanted and the pellets resuspended in 2 ml ethanol using sonication. Centrifugation was then repeated and the solvent removed. Fresh ethanol (2 ml) was used to resuspend the particles before their addition to a 10 ml round bottom flask. Afterwards, 1 ml of 75 mM 3,4,3-LI(1,2-HOPO) (Ash Stevens, Inc.) in pH 6.0 50 mM Hepes was added, and the reaction was capped. The mixture was stirred overnight at 75° C., to promote ligand binding to the nanoparticles, and washed five times in ethanol using alternating centrifugation and sonication steps.

Transmission Electron Microscopy (TEM)

Figure 6A:
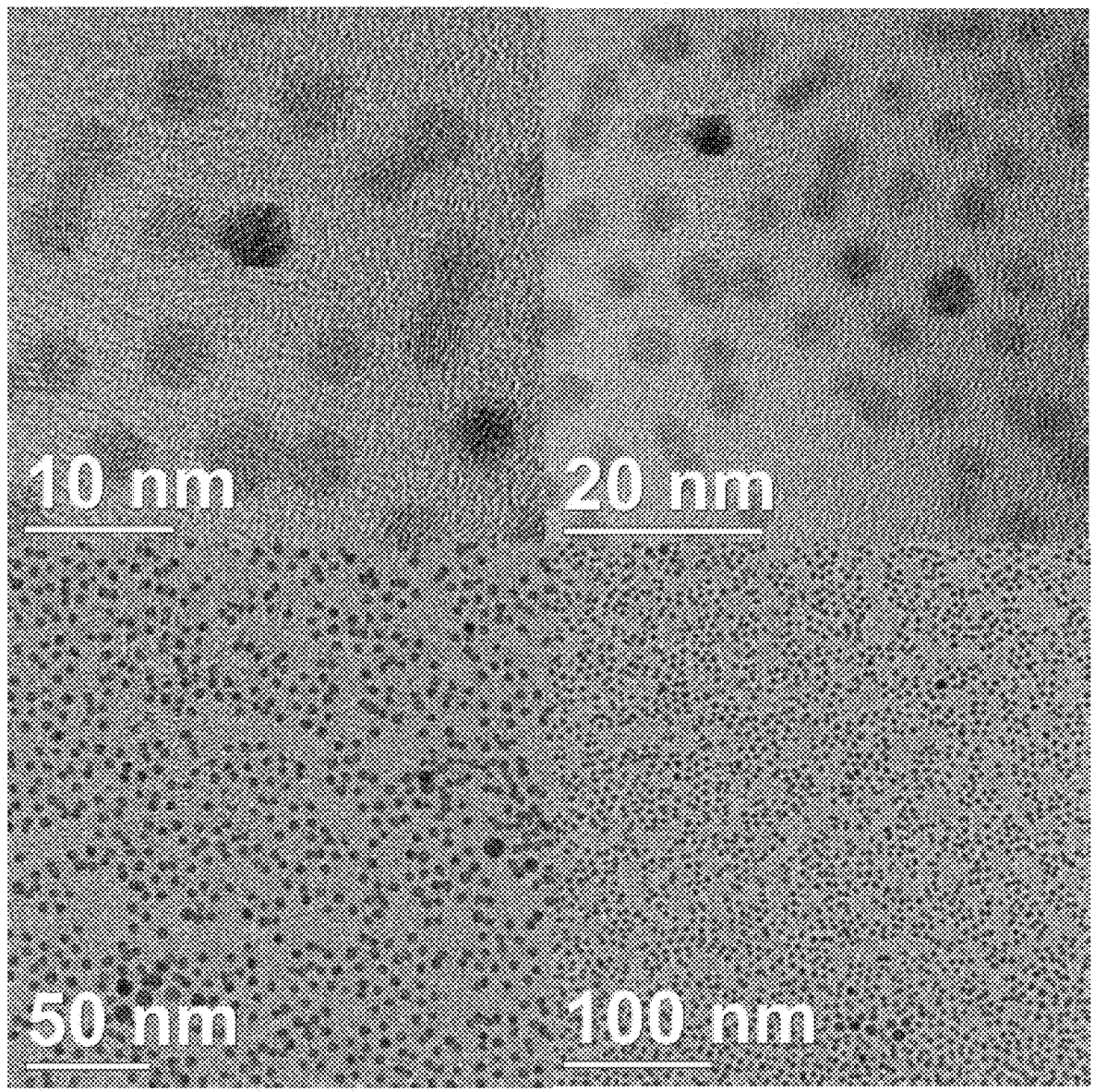
FIGS. 6A and 6B are TEM images of nanocrystals. Functionalization with 3,4,3 promotes a higher degree of aggregation than observed with the unmodified particles.
Figure 6B:
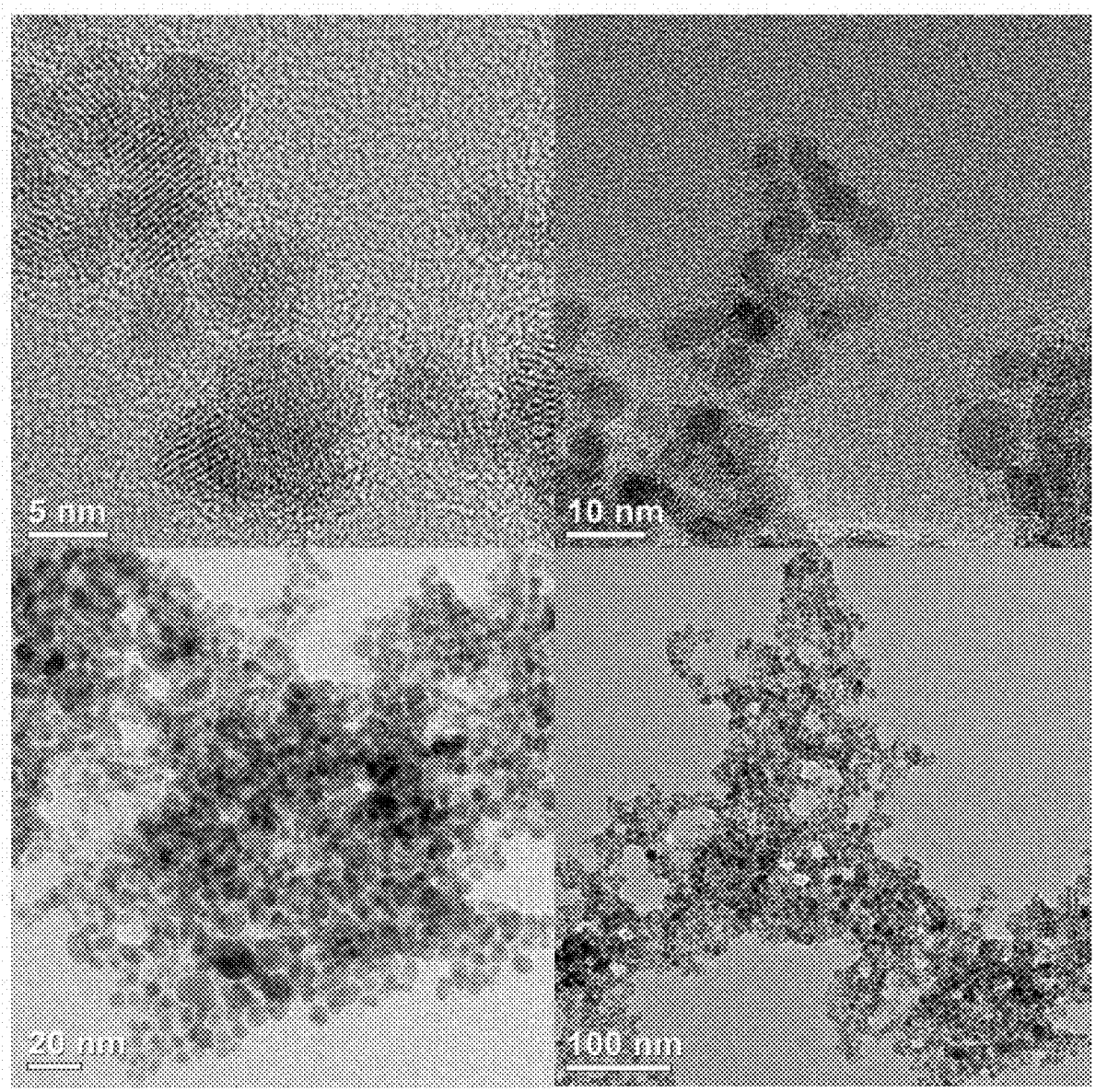

TEM images were collected on a JEOL JEM-2100 LaB6 microscope. Stock suspensions of nanoparticles in cyclohexane were diluted by 1/5 in ethanol and dropcast onto TEM grids. Samples were mounted onto a single-tilt sample holder. Images were collected using a high-tension voltage of 200 kV (112 μA beam current), with exposure times limited to 100 ms. Images showing the results are provided in FIGS. 6A and 6B.

UV-Vis Spectroscopy

Absorption spectra were collected on a Molecular Devices SPECTRAmax Plus 384 UV-Vis spectrometer. Nanoparticle suspensions were formed in ethanol and scattering at 500 nm was measured. Samples were diluted appropriately so that their $A_{500}$ values were approximately 0.3, an optical density yielding stable colloidal suspensions in this solvent. Absorption spectroscopy also provided a qualitative measurement of nanoparticle:surface ligand ratios, through comparison of scattering intensities ($A_{500}$) relative to the peak 343 absorption at 325 nm.

Steady-State Luminescence Spectroscopy

Steady-state luminescence spectra were acquired on a Jobin Yvon Horiba Fluorolog system. Luminescence spectra of nanoparticles were collected using a 317 nm excitation wavelength sourced from a xenon arc lamp, 1 nm excitation/3 nm emission slit settings and 1.0 s integration times at 1 nm resolution. Due to the overlap of our emission window (550-750 nm) with the second-harmonic of our excitation beam, a 400 nm longpass filter was placed between the sample and detector to remove beam-generated interference for all luminescence measurements. Excitation (action) spectra were collected by monitoring the $^5D_0 \rightarrow {}^7F_2$ transition at 612 nm using 1 nm slits for both excitation and emission monochromators and 1.0 s integration times at 1 nm resolution. Nanoparticle samples were prepared as dilute solutions in ethanol to ensure stability of the suspension over the course of data collection ($A_{500} \sim 0.3$; 0.1 mg ml$^{-1}$).

Determination of the triplet state of 3,4,3-LI(1,2-HOPO) was achieved through measurement of the 77 K spectrum of the Gd-343 metal-ligand complex (180 μM) and NaGdF$_4$-343 nanoparticles in ethanol. Spectra were acquired using parameters of 1 nm excitation/3 nm emission slits, 317 nm excitation, 1.0 s integration times and a luminescence window spanning 325 to 750 nm. For emission wavelengths longer or exceeding 600 nm, the 400 nm long pass filter was again used to remove secondary harmonic noise originating from the excitation source.

Time-Resolved Luminescence Spectroscopy

Donor luminescence lifetimes were acquired through measurement of the 343 phosphorescence decay rate at 77 K, using the Fluorolog system in time-resolved (MCS lifetime) mode. Excitation parameters were as follows: 317 nm excitation, 14 nm excitation bandpass; 525 nm observation, 1 nm emission bandpass; 10 μs channel$^{-1}$ and 3000 channels sweep$^{-1}$ (30.0 ms observation window). Time-resolved data were fit to multi-exponential decay functions in MATLAB with the minimum number of components needed to provide a zero residual (Supplemental Information).

Quantum Yield Measurement

A detailed description of quantum yield procedures and raw data can be found below.

In some embodiments, one can also employ sensitizing curium-doped NaGdF$_4$/NaYF$_4$ lattices, favored by a high quantum yield (~45%) in the Cm$^{3+}$-343 metal-ligand complex[27]. Indeed, when Eu is replaced by Cm in the nanocrystal, the same behavior is observed when the crystal is coated with the ligand.

Supporting Information

Detailed descriptions of direct, f-f nanoparticle excitation, time-resolved luminescence, TEM imaging instrument characterization and quantum yield measurement procedures are presented below.

External quantum yields were determined using an integrated sphere according to the methodology of Mello et. al.[26] The placement of a neutral density filter between the sphere's exit port and the PMT detector when measuring the excitation beam signals required a small modification of Mello's equation:

$$\Phi = f_{exc}\left[\frac{P_c - (1-A)P_b}{L_a A}\right];$$

$$A = 1 - \frac{L_c}{L_b}.$$

Pb,c are the integrated Eu emission spectra acquired under the respective conditions of indirect and direct excitation in the sphere. La,b,c represent the filtered, integrated excitation beam as measured for the respective cases of no sample, indirect sample excitation and direct sample excitation. The factor fexc represents the fraction of excitation light transmitted by the filter. The filter's light transmission at 355 nm was determined through measurement of the lamp excitation beam at 355 nm with 1 nm excitation and emission slit settings at an 0.1 nm resolution in both the presence and absence of the filter. A light transmission factor, calculated from the ratio of the integrated spectra of filtered to unfiltered light, was found to be 0.160 at 355 nm (FIG. 7). The integrated sphere setup used for these experiments was benchmarked using quinine sulfate as a standard (literature value: Φ=0.54). Quinine sulfate standards (Sigma-Aldrich) were prepped as dilute solutions (peak absorption ~0.05) in 50 mM H2SO4. Five independent determinations gave Φ=0.557±0.046 (8.2% error). Samples were made such that the particle scattering intensity at 500 nm was ~0.3 and the ligand absorption intensity at 355 nm fell in the approximate range of 0.01-0.07 (after subtracting light scatter contributions to the scatter intensity by using the ligand-free nanoparticles as a baseline).

Instrument parameters were as follows: Eu emission spectra were collected using 1 nm slits for both excitation and emission, under 355 nm sample excitation and a 550-750 nm observation window at 1 nm spectral resolution. Quinine sulfate spectra were acquired similarly, with a 365-600 nm emission range. Lamp spectra at 355 nm were collected using both emission and excitation slits of 1 nm, an observation window from 350-358 nm, and 0.05 nm resolution. All spectra for quantum yield calculations were collected using 4.0 s signal integration times.

Corrections for quantum yield luminescence spectra consisted of two types: the subtraction of residual solvent autoluminescence and a response adjustment for any wavelength-dependent light transmission bias of the sphere. Subtractive corrections were done through acquisition of luminescence spectra using pure ethanol using the same excitation parameters as for the sample.

Spectral adjustments for wavelength-dependent response of the sphere were determined by measuring the luminescence spectra of either quinine sulfate (400-600 nm) or fluorescein isothiocyanate (FITC, Sigma-Aldrich) from 600-

710 nm both inside and outside the integrated sphere. An empirical function describing the integrated sphere's light transmission response, r(λ), was then derived from the following relation:

$$r(\lambda) = \frac{S_{NoSphere}(\lambda)}{S_{sphere}(\lambda)},$$

where S is the luminescence spectrum of quinine sulfate or FITC. Integrated sphere luminescence spectra were then corrected for sphere response through multiplication by r(λ).

Integrated Spectra for Quantum Yields

Lamp integrals (La, Lb, Lc) represent values before filter factor (0.16) adjustment. Luminescence integrals (Pb, Pc) are determined from the background-corrected and sphere bias-corrected spectra.

NaGdF4:Eu-343 (5% Doped) Samples In Ethanol

Batch 1:
Ligand A355 = 0.01

| Dataset | | Integral |
|---|---|---|
| 1 | Pb | 11275.5496614 |
| 2 | Pc | 3700690.3096 |
| 3 | La | 1979313857.93 |
| 4 | Lb | 1909195565.21 |
| 5 | Lc | 1817731869.62 |

QY = .0389

Batch 2:
Ligand A355 = 0.07

| Dataset | | Integral |
|---|---|---|
| 1 | Pb | 2096382.601 |
| 2 | Pc | 7794295.83645 |
| 3 | La | 335337401.589 |
| 4 | Lb | 318251456.084 |
| 5 | Lc | 286394603.712 |

QY = .0282

Batch 3:
Ligand A355 = 0.04

| Dataset | | Integral |
|---|---|---|
| 1 | Pb | 425023.573935 |
| 2 | Pc | 6076751.62817 |
| 3 | La | 335405788.309 |
| 4 | Lb | 317894667.62 |
| 5 | Lc | 289363162.917 |

QY = .0302

| Average QY | QY std. Dev. |
|---|---|
| 0.0327 | 0.0057 |

Example 2

A method of producing two-photon emission is provided in the present example. One provides a collection of nanoparticles in a layer. The nanoparticles include a 3,4,3-LI(1,2-HOPO) ligand coating on the outside shell of the nanoparticles. The shell contains a single lanthanide dopant and coats a core, which contains the same lanthanide element in addition to the particular lanthanide, Yb. One then irradiates the 3,4,3-LI(1,2-HOPO). This results in transferring energy from 3,4,3-LI(1,2-HOPO) to the second lanthanide located in the shell, which in turn transfers energy from the second lanthanide to the first lanthanide, located in the core, which in turn transfers energy from the first lanthanide to Yb, which is also in the core. Yb in turn emits two photons for each photon that excited 3,4,3-LI(1,2-HOPO). The first and second lanthanide are the same type of lanthanide. Yb emission occurs at wavelengths between 950 and 1100 nm, wavelengths where silicon solar cell power generation efficiency is highest.

Example 3

A method of providing electricity is provided in the present example. One first provides a photovoltaic cell comprising a lanthanide nanocrystal that comprises $NaGd_{1-x}Eu_xF_4$, where x is between 0 and 1. The lanthanide nanocrystals are coated with 3,4,3-LI(1,2-HOPO). One then illuminates the 3,4,3-LI(1,2-HOPO) ligand on the nanocrystals with UV radiation such that the ligand absorbs energy in the UV spectrum. Energy is transferred to $NaGd_{1-x}Eu_xF_4$, and is emitted onto the photovoltaic cell at a wavelength that enhances the ability of the photovoltaic cell to generate electricity In the case of Eu, the emitted light is at wavelengths in the red portion of the light spectrum, between 580 and 720 nm.

This invention has been described herein to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

REFERENCES

[1] W. Shockley, H. J. Queisser, *J. Appl. Phys.* 1961, 32, 510.
[2] B. M. van der Ende, L. Aarts, A. Meijerink, *Phys. Chem. Chem. Phys.* 2009, 11, 11081.
[3] C. Liu, H. Wang, X. Zhang, D. Chen, *J. Mater. Chem.* 2009, 19, 489.
[4] F. Wang, R. Deng, X. Liu, *Nat. Protoc.* 2014, 9, 1634.
[5] X. Li, R. Wang, F. Zhang, D. Zhao, *Nano Lett.* 2014, 14, 3634.
[6] H. S. Jang, K. Woo, K. Lim, *Opt. Express* 2012, 20, 17107.
[7] Z.-L. Wang, J. H. Hao, H. L. W. Chan, *J. Mater. Chem.* 2010, 20, 3178.
[8] W. Zhu, D. Chen, L. Lei, J. Xu, Y. Wang, *Nanoscale* 2014, 6, 10500.
[9] L. C. Mimun, G. Ajithkumar, M. Pokhrel, B. G. Yust, Z. G. Elliott, F. Pedraza, A. Dhanale, L. Tang, A.-L. Lin, V. P. Dravid, D. K. Sardar, *J. Mater. Chem.* B 2013, 1, 5702.
[10] G. Chen, T. Y. Ohulchanskyy, S. Liu, W. C. Law, F. Wu, M. T. Swihart, H. Ågren, P. N. Prasad, *ACS Nano* 2012, 6, 2969.
[11] S. Ye, B. Zhu, J. Luo, J. Chen, G. Lakshminarayana, J. Qiu, *Opt. Express* 2008, 16, 8989.
[12] X. Li, R. Wang, F. Zhang, L. Zhou, D. Shen, C. Yao, D. Zhao, *Sci. Rep.* 2013, 3, DOI 10.1038/srep03536.
[13] J.-C. G. Bünzli, C. Piguet, *Chem. Soc. Rev.* 2005, 34, 1048.
[14] J.-C. G. Bünzli, *Chem. Rev.* 2010, 110, 2729.
[15] C. Li, Z. Song, Y. Li, K. Lou, J. Qiu, Z. Yang, Z. Yin, X. Wang, Q. Wang, R. Wan, *Spectrochim. Acta. A. Mol. Biomol. Spectrosc.* 2013, 114, 575.

[16] W. Zou, C. Visser, J. A. Maduro, M. S. Pshenichnikov, J. C. Hummelen, *Nat. Photonics* 2012, 6, 560.
[17] M. Banski, A. Podhorodecki, J. Misiewicz, *Phys. Chem. Chem. Phys.* 2013, 15, 19232.
[18] D. Wawrzynczyk, A. Bednarkiewicz, M. Nyk, W. Strek, M. Samoc, *J. Nanoparticle Res.* 2013, 15, DOI 10.1007/s11051-013-1707-1.
[19] E. G. Moore, C. J. Jocher, J. Xu, E. J. Werner, K. N. Raymond, *Inorg. Chem.* 2007, 46, 5468.
[20] R. J. Abergel, A. D'Aléo, C. Ng Pak Leung, D. K. Shuh, K. N. Raymond, *Inorg. Chem.* 2009, 48, 10868.
[21] M. Sturzbecher-Hoehne, C. Ng Pak Leung, A. D'Aléo, B. Kullgren, A.-L. Prigent, D. K. Shuh, K. N. Raymond, R. J. Abergel, *Dalton Trans.* 2011, 40, 8340.
[22] L. J. Daumann, D. S. Tatum, B. E. R. Snyder, C. Ni, G. Law, E. I. Solomon, K. N. Raymond, *J Am. Chem. Soc.* 2015, 137, 2816.
[23] J. R. Lakowicz, Ed., *Principles of Fluorescence Spectroscopy*, Springer US, Boston, Mass., 2006.
[24] G. Lakshminarayana, H. Yang, S. Ye, Y. Liu, J. Qiu, *J. Mater. Res.* 2008, 23, 3090.
[25] J. T. van Wijngaarden, S. Scheidelaar, T. J. H. Vlugt, M. F. Reid, A. Meijerink, *Phys. Rev. B* 2010, 81, 155112.
[26] S. Ye, Y. Katayama, S. Tanabe, *J Non-Cryst. Solids* 2011, 357, 2268.
[27] M. Sturzbecher-Hoehne, B. Kullgren, E. E. Jarvis, D. D. An, R. J. Abergel, *Chem.—Eur. J* 2014, 20, 9962.

What is claimed is:

1. A light conversion material, comprising: a lanthanide nanocrystal and a HOPO containing chelator, wherein the lanthanide nanocrystal comprises $NaGd_{1-x}Eu_xF_4$, wherein x is between 0 and 1, wherein the HOPO containing chelator comprises 3,4,3-LI(1,2-HOPO), wherein 3,4,3-LI(1,2-HOPO) is attached to a surface of the lanthanide nanocrystal, wherein 3,4,3-LI(1,2-HOPO) is configured to downconvert light from UV to visible, and wherein the light conversion material is configured to provide for at least a two order of magnitude increase in light absorption by NaGd1-xEuxF4 as compared to light absorption by NaGd1-xEuxF4 without 3,4,3-LI(1,2-HOPO).

2. A photovoltaic cell comprising: a lanthanide nanocrystal and a HOPO containing chelator, wherein the lanthanide nanocrystal comprises $NaGd_{1-x}Eu_xF_4$, wherein x is between 0 and 1, wherein the HOPO containing chelator comprises 3,4,3-LI(1,2-HOPO), wherein 3,4,3-LI(1,2-HOPO) is attached to a surface of the lanthanide nanocrystal wherein 3,4,3-LI(1,2-HOPO) is configured to downconvert light from UV to visible, and wherein the photovoltaic cell is configured to provide for at least a two order of magnitude increase in light absorption by $NaGd_{1-x}Eu_xF_4$ as compared to light absorption by $NaGd_{1-x}Eu_xF_4$ without 3,4,3-LI(1,2-HOPO).

3. The photovoltaic cell of claim 2, wherein the 3,4,3-LI(1,2-HOPO) is configured to downconvert UV radiation to near-infrared wavelengths.

4. The photovoltaic cell of claim 2, wherein the lanthanide nanocrystal comprises $NaGd_{0.9}Eu_{0.05}F_4$.

5. The photovoltaic cell of claim 2, wherein the lanthanide is a luminescent lanthanide.

6. The photovoltaic cell of claim 2, further comprising bulk silicon configured and positioned to absorb light emitted from the lanthanide nanocrystal.

7. A nanocrystal comprising:
a $NaGd_{1-x}Eu_xF_4$ nanocrystal, wherein x is between 0 and 1; and
a 3,4,3-LI(1,2-HOPO) ligand.

8. The nanocrystal of claim 7, wherein the 3,4,3-LI(1,2-HOPO) ligand coats a surface of the nanocrystal.

9. A method of downconverting light from UV to visible, the method comprising:
illuminating a 3,4,3-LI(1,2-HOPO) ligand with UV radiation such that the ligand absorbs energy in the UV spectrum; and
transfers energy to $NaGd_{1-x}Eu_xF_4$, wherein x is between 0 and 1,
wherein the method provides for at least a two order of magnitude increase in light absorption by $NaGd_{1-x}Eu_xF_4$ as compared to light absorption by $NaGd_{1-x}Eu_xF_4$ without 3,4,3-LI(1,2-HOPO) ligand.

10. The method of claim 9, wherein light absorption from the ligand allows for at least a three order of magnitude increase in light absorption through the method, as opposed to using $NaGd_{1-x}Eu_xF_4$ without the ligand.

11. A nanoparticle comprising:
a core, wherein the core comprises a first lanthanide and Yb; and
a shell coating the core, wherein the shell is doped with a second lanthanide and wherein the shell comprises 3,4,3-LI(1,2-HOPO), wherein the first lanthanide and the second lanthanide are a same lanthanide, wherein the nanoparticle comprises $NaGd_{1-x}Eu_xF_4$, wherein x is between 0 and 1, and wherein 3,4,3-LI(1,2-HOPO) is attached to a surface of the nanoparticle,
wherein the nanoparticle is configured to provide for at least a two order of magnitude increase in light absorption by $NaGd_{1-x}Eu_xF_4$ as compared to light absorption by $NaGd_{1-x}Eu_xF_4$ without 3,4,3-LI(1,2-HOPO).

12. The nanoparticle of claim 11, wherein the nanoparticle displays $Yb^{3+}$ emission between 950 and 1060 nm upon illumination with UV light.

13. The nanoparticle of claim 11, wherein the nanoparticle can generate two infrared photons for a single photon absorbed by 3,4,3-LI(1,2-HOPO).

14. The nanoparticle of claim 11, wherein the first lanthanide and the second lanthanide is one or more of $Pr^{3+}$, $Nd^{3+}$ or $Tb^{3+}$.

15. The nanoparticle of claim 11, wherein the shell is singly doped.

16. A method of producing two-photon emission, the method comprising:
providing a nanoparticle as claimed in claim 11;
irradiating the 3,4,3-LI(1,2-HOPO);
transferring energy from 3,4,3-LI(1,2-HOPO) to the second lanthanide;
transferring energy from the second lanthanide to the first lanthanide;
transferring energy from the first lanthanide to Yb, wherein the first lanthanide and the second lanthanide are a same lanthanide; and
emitting two photons from Yb a photon that excited 3,4,3-LI(1,2-HOPO).

17. The method of claim 16, further comprising cooling the nanoparticle.

18. The method of claim 17, wherein the nanoparticle has a temperature of about 77-350K.

* * * * *